(12) United States Patent (10) Patent No.: US 9,136,505 B2
Sasaki et al. (45) Date of Patent: Sep. 15, 2015

(54) LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Takeru Sasaki, Kanagawa (JP); Tomoya Aoyama, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 224 days.

(21) Appl. No.: 13/676,400

(22) Filed: Nov. 14, 2012

(65) Prior Publication Data

US 2013/0119358 A1 May 16, 2013

(30) Foreign Application Priority Data

Nov. 15, 2011 (JP) ................................. 2011-249590

(51) Int. Cl.
*H01L 29/08* (2006.01)
*H01L 35/24* (2006.01)
*H01L 51/00* (2006.01)
*H01L 51/52* (2006.01)

(52) U.S. Cl.
CPC .......... *H01L 51/529* (2013.01); *H01L 51/5243* (2013.01)

(58) Field of Classification Search
CPC .......................... H01L 51/5243; H01L 51/529
See application file for complete search history.

(56) References Cited

U.S. PATENT DOCUMENTS

| 6,977,394 | B2 | 12/2005 | Yamazaki et al. |
| 7,825,002 | B2 | 11/2010 | Takayama et al. |
| 2009/0079335 | A1* | 3/2009 | Mitsuya et al. ............... 313/504 |
| 2011/0018416 | A1 | 1/2011 | Sassa |
| 2011/0175101 | A1* | 7/2011 | Hatano et al. .................... 257/72 |
| 2011/0175102 | A1* | 7/2011 | Hatano ............................ 257/72 |

FOREIGN PATENT DOCUMENTS

| JP | 2006-128023 A | 5/2006 |
| JP | 2006-244846 A | 9/2006 |
| JP | 2008-234890 | 10/2008 |
| JP | 2009-245770 | 10/2009 |
| JP | 2011-034747 A | 2/2011 |

* cited by examiner

*Primary Examiner* — Meiya Li
(74) *Attorney, Agent, or Firm* — Husch Blackwell LLP

(57) ABSTRACT

Provided is a light-emitting device having a light-emitting portion having a light-emitting element in a space surrounded by a support substrate, a metal substrate, and a sealing material, in which the sealing material is provided to surround the periphery of the light-emitting portion, the light-emitting element has a first electrode, a layer having a light-emitting organic compound, and a second electrode, the support substrate and the first electrode are each capable of transmitting light emitted from the light-emitting organic compound, and the space contains gas inert to the light-emitting element or is in a vacuum. The light-emitting device has, over the second electrode, a first high-emissivity layer that has higher emissivity than the second electrode and is thermally connected to the second electrode, and a low-reflectivity layer with which a metal substrate surface facing the support substrate is provided and which has lower reflectivity than the metal substrate.

28 Claims, 9 Drawing Sheets

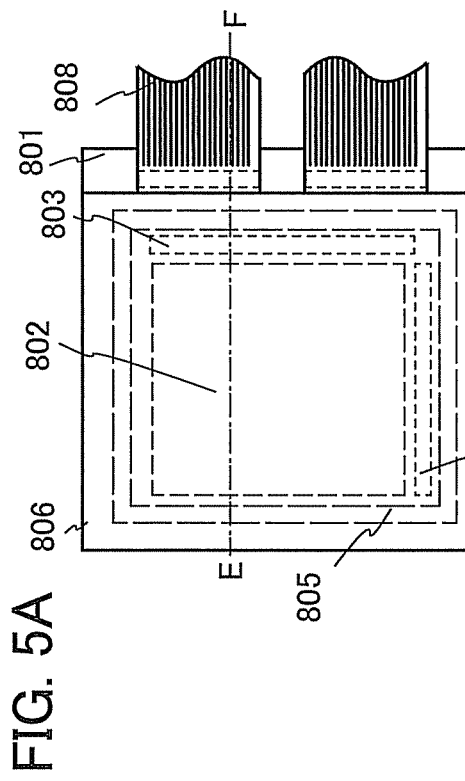
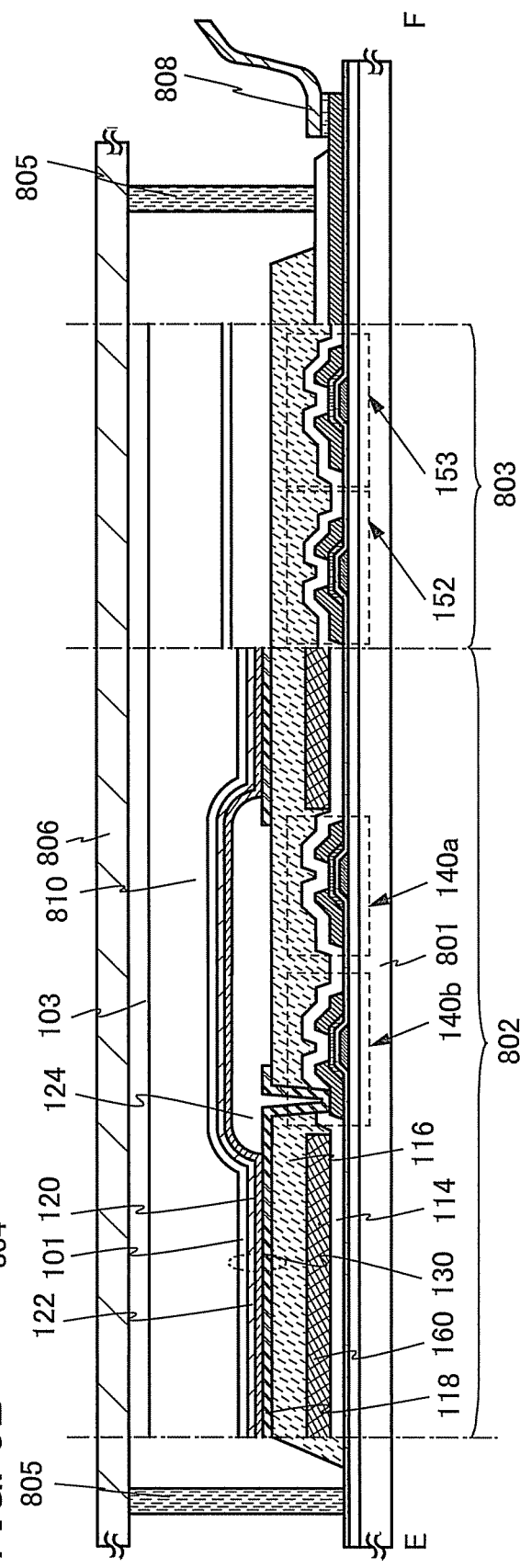
FIG. 5A
FIG. 5B

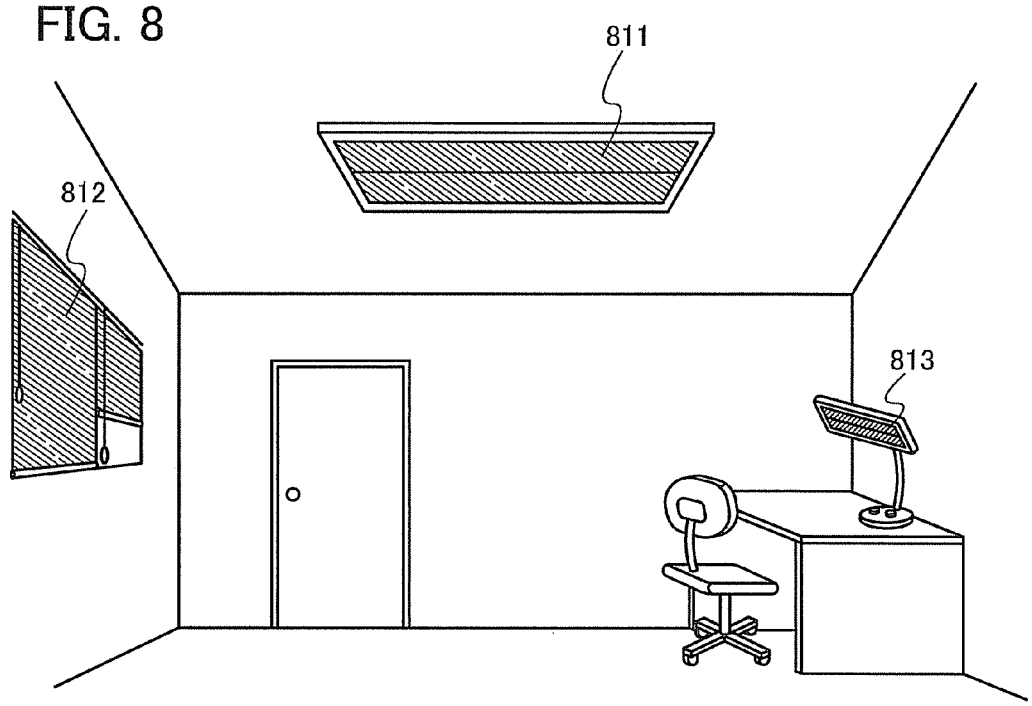

LIGHT-EMITTING DEVICE, ELECTRONIC DEVICE, AND LIGHTING DEVICE

BACKGROUND OF THE INVENTION

1. Field of the Invention

The present invention relates to a light-emitting device, an electronic device, and a lighting device each using organic electroluminescence (EL).

2. Description of the Related Art

A light-emitting element (also referred to as an organic EL element) using organic EL has been actively researched and developed. In the fundamental structure of an organic EL element, a layer including a light-emitting organic compound is provided between a pair of electrodes. By voltage application to this element, light emission from the light-emitting organic compound can be obtained.

An organic EL element, which has characteristics such as feasibility of being thinner and lighter, high speed response to input signals, and capability of direct current low voltage driving, has been expected to be applied to next-generation flat panel displays or lighting devices. A display device in which organic EL elements are arranged in matrix is considered to have advantages of a wide viewing angle and excellent visibility over a conventional liquid crystal display device. Organic EL elements can be formed in the form of a film and therefore can easily constitute large-area elements, and also have great potential as planar light sources applicable to lighting and the like.

A problem of organic EL elements is that its light-emitting properties (e.g., luminance) and reliability are impaired by heat.

Since organic EL elements are self-luminous elements, they generate heat to raise their temperature when driven. The luminance of an organic EL element is temperature-dependent and therefore a rise in the temperature of an organic EL element might diminish its luminance. Further, a rise in the temperature of an organic EL element might degrade organic compounds forming the element, which reduces the lifetime of the element.

In view of the foregoing, research and development are being conducted on techniques for reducing a rise in the temperature of an organic EL element by emission of heat generated by the element to the outside thereof.

For example, Patent Document 1 discloses an organic EL panel in which a heat dissipating layer is provided on a light-emitting element.

Another problem of organic EL elements is that their reliability is impaired by impurities such as moisture or oxygen entering from the outside.

When impurities such as moisture or oxygen enter an organic compound or a metal material included in an organic EL element from the outside thereof, the lifetime of the organic EL element might be significantly shortened. This is because an organic compound or a metal material included in the organic EL element reacts with the impurities such as moisture or oxygen and is consequently degraded.

In view of the foregoing, research and development are being conducted on techniques for sealing an organic EL element to prevent entry of impurities.

For example, known sealing techniques are the technique by which an organic EL element is sealed between a support substrate provided with the element and a thin film (hereinafter, also referred to as film sealing) and the technique by which a support substrate and a sealing substrate are bonded to each other with resin, glass frit, or the like and an organic EL element is sealed between the support substrate provided with the element and the sealing substrate.

In the film sealing, productivity is low and accordingly problems such as high cost arise. In contrast, cost is low and productivity is high in the technique for sealing an organic EL element with a pair of substrates using resin, glass frit, or the like, and hence it is considered a preferable sealing technique.

For example, in the organic EL panel disclosed in Patent Document 1, a substrate provided with the light-emitting element and the like and a sealing substrate to which a drying agent is attached are bonded to each other with an ultraviolet curable resin.

As the sealing substrate, a metal substrate using a metal material or an alloy material is known.

Also known are so-called hollow sealing by which a space where an organic EL element is sealed is filled with gas, solid sealing by which such a space is filled with solid, and liquid sealing by which such a space is filled with liquid.

<Light-Emitting Device Employing Liquid Sealing>

A problem is that, since complete removal of impurities in the liquid is difficult, impurities such as moisture and oxygen remaining in the liquid adversely affect an organic EL element.

<Light-Emitting Device Employing Solid Sealing>

When a light-emitting device is subjected to impact such as external force through the sealing substrate side, an organic EL element in contact with the sealing substrate with the solid interposed therebetween tends to be affected by the external force. This makes the element likely to have a short circuit between its anode and cathode or to be broken. This is because solid is more difficult to deform than liquid or gas and cannot easily absorb or reduce impact such as external force. Such a problem also lies in the adoption of the above-described film sealing.

Furthermore, stress might concentrate at an extraneous substance derived from the solid which has entered the light-emitting device during process, which allows the extraneous substance pressed onto the element to cause a short circuit between the anode and cathode of the element.

<Light-Emitting Device Employing Hollow Sealing>

In a light-emitting device employing hollow sealing, owing to a space containing gas between a sealing substrate and an organic EL element, it is possible to prevent direct application of external force to the organic EL element, which might break the element, even when impact such as external force is applied through the sealing substrate side. Therefore the yield and reliability of the light-emitting device employing hollow sealing are higher than those of a light-emitting device employing solid sealing or liquid sealing.

REFERENCE

Patent Document 1: Japanese Published Patent Application No. 2008-234890

SUMMARY OF THE INVENTION

However, in the hollow sealing, because the thermal conductivity of the gas contained in the space is low, it is difficult to conduct heat generated by the organic EL element from the organic EL element to the sealing substrate through the space and further difficult to emit the heat to the outside of the light-emitting device. That is, it is difficult to transfer heat generated by the organic EL element to the outside of the organic EL element.

A method of transferring heat is thermal radiation, in addition to thermal conduction. Thermal radiation, a phenomenon in which thermal energy is emitted as an electromagnetic wave from an object, allows heat to be transferred even when there is no substance capable of conducting heat (e.g., there is a vacuum) between two objects.

However, in the case where a metal substrate is used as the sealing substrate, since a metal material or an alloy material has high reflectivity, the metal substrate might reflect an electromagnetic wave emitted from a layer having high emissivity, which allows thermal energy to return to the organic EL element.

For example, in Patent Document 1, the heat dissipating layer is provided on the light-emitting element. However, transferring heat from the heat dissipating layer to a metal substrate by thermal conduction and thermal radiation is difficult if the metal substrate is used as the sealing substrate, and therefore reducing a rise in the temperature of the organic EL element is difficult.

Thus, an object of one embodiment of the present invention is to provide a light-emitting device using an organic EL element, in which reliability decrease due to impurities such as moisture and oxygen and external force can be reduced and reliability decrease due to heat can also be reduced.

An object of one embodiment of the present invention is to provide a highly reliable electronic device or a highly reliable lighting device, including the light-emitting device.

An organic EL element includes a layer including a light-emitting organic compound (also referred to as an EL layer) between a pair of electrodes. In the case of a bottom emission structure, the element includes, over a support substrate, a first electrode capable of transmitting light emitted from the EL layer, the EL layer over the first electrode, and a second electrode over the EL layer. A material of the second electrode is preferably a material having high reflectivity, for example, a metal material or an alloy material. Note that in general, a metal material and an alloy material have high thermal conductivity but low emissivity and low transmissivity.

Further, a bottom emission light-emitting device employing hollow sealing includes an organic EL element in a space which is surrounded by a support substrate, a sealing substrate, and a sealing material and contains gas. Accordingly, it is difficult to conduct heat generated by the organic EL element through the space and to transfer the heat to the sealing substrate side.

As the sealing substrate, a metal substrate using a metal material or an alloy material can be used. A metal material and an alloy material, which have high thermal conductance, are preferred in that they can easily conduct heat into the whole sealing substrate and accordingly can reduce a local rise in the temperature of the light-emitting device. However, a metal material and an alloy material have high reflectivity as described above.

The present inventors have reached an idea of a structure of the light-emitting device which includes, over the second electrode, a layer having high emissivity (also referred to as a high-emissivity layer or a first layer) which is thermally connected to the second electrode and a layer having low reflectivity (also referred to as a low-reflectivity layer or a second layer) with which a metal substrate surface facing the support substrate is provided. In this structure, heat generated by an organic EL element can be emitted as an electromagnetic wave from the layer having high emissivity to the layer having low reflectivity, and reflection of the electromagnetic wave and return thereof to the organic EL element are hampered. Thus a rise in the temperature of the organic EL element can be reduced.

In this specification, the expression "A is thermally connected to B" means not only that A is directly connected to B but also that A is connected to B with another layer interposed therebetween as long as heat is conducted between A and B.

One embodiment of the present invention is a light-emitting device including a light-emitting portion including a light-emitting element in a space surrounded by a support substrate, a metal substrate, and a sealing material. In the light-emitting device of one embodiment of the present invention, the sealing material is provided to surround the periphery of the light-emitting portion. Further, the light-emitting element includes a first electrode over the support substrate, a layer including a light-emitting organic compound, over the first electrode, and a second electrode over the layer including a light-emitting organic compound. Further, the support substrate and the first electrode are each capable of transmitting light emitted from the light-emitting organic compound, and the space contains gas. The light-emitting device of one embodiment of the present invention includes, over the second electrode, a first high-emissivity layer that has higher emissivity than the second electrode and is thermally connected to the second electrode, and a low-reflectivity layer with which a metal substrate surface facing the support substrate is provided and which has lower reflectivity than the metal substrate.

In the above light-emitting device, the organic EL element is provided in the space surrounded by the support substrate, the metal substrate, and the sealing material. Hence it is possible to reduce deterioration of the organic EL element due to entry of impurities such as moisture and oxygen from the outside of the light-emitting device.

Furthermore, in the above light-emitting device, owing to the space containing gas between the metal substrate and the organic EL element, it is possible to prevent direct application of external force to the organic EL element, which might break the element, even when impact such as external force is applied to the metal substrate.

Further, the above light-emitting device includes the first high-emissivity layer and the low-reflectivity layer. In the above light-emitting device, heat generated by the organic EL element is conducted from the second electrode to the first high-emissivity layer. Then, thermal radiation occurs from the first high-emissivity layer to the low-reflectivity layer, which results in emission of the heat generated by the organic EL element to the outside thereof. Even when the heat is emitted as an electromagnetic wave from the first high-emissivity layer, the electromagnetic wave is hardly reflected by the low-reflectivity layer and accordingly return of the heat to the organic EL element is hampered. Thus a rise in the temperature of the organic EL element can be reduced and decrease of the reliability of the light-emitting device due to heat generation of the organic EL element can be reduced.

In the above light-emitting device, the low-reflectivity layer is preferably provided in a region overlapping with the first high-emissivity layer. In such a structure, the path from the first high-emissivity layer to the low-reflectivity layer is shortened and accordingly the heat generated by the organic EL element can be efficiently transferred to the outside of the element.

Further, in the above light-emitting device, the first high-emissivity layer preferably has higher thermal conductivity than the layer including a light-emitting organic compound (EL layer). When the thermal conductivity of the first high-emissivity layer is higher than that of the EL layer, heat in the second electrode is conducted more to the first high-emissivity layer than to the EL layer. Accordingly, the heat generated by the organic EL element can be efficiently transferred to the outside of the element. The thermal conductivity of the first high-emissivity layer is preferably higher, in which case the heat can be more easily conducted into the whole first high-emissivity layer and a local temperature rise can be reduced. Further, the heat can be efficiently transferred (emitted) to the low-reflectivity layer.

Further, in the above light-emitting device, the second electrode and the first high-emissivity layer are preferably thermally connected with a first thermal conduction layer interposed therebetween, which has higher thermal conductivity than the layer including a light-emitting organic compound (EL layer). Since the first thermal conduction layer has higher thermal conductivity than the EL layer, heat in the second electrode is conducted more to the first thermal conduction layer than to the EL layer. Accordingly, the heat generated by the organic EL element can be efficiently transferred to the outside of the element.

Poor adhesion (or bond strength) between the second electrode and the first high-emissivity layer might prevent sufficient heat conduction to the first high-emissivity layer even when the second electrode (and also the first high-emissivity layer) has high thermal conductivity. In such a case, the above structure is particularly preferred. The first thermal conduction layer between the second electrode and the first high-emissivity layer achieves good adhesion between the second electrode and the first thermal conduction layer and between the first thermal conduction layer and the first high-emissivity layer. Such a structure facilitates heat conduction from the second electrode to the first high-emissivity layer, which can promote the emission of the heat generated by the organic EL element to the outside thereof. Accordingly, a rise in the temperature of the organic EL element can be reduced and decrease of the reliability of the light-emitting device due to heat generation of the organic EL element can be reduced.

Further, in the above light-emitting device, the thermal conductivity of the low-reflectivity layer is preferably greater than or equal to 1 W/m·K. The thermal conductivity of the low-reflectivity layer is preferably higher, in which case the heat can be more easily conducted into the whole low-reflectivity layer and a local temperature rise can be reduced. Further, the heat can be efficiently transferred (conducted) to the metal substrate.

Further, in the above light-emitting device, when a layer in contact with the low-reflectivity layer is a layer having high thermal conductance, heat conduction from the low-reflectivity layer to the layer in contact therewith can be promoted. Thus a layer in contact with the low-reflectivity layer is preferably a layer having high thermal conductance. For example, in a structure of one embodiment of the present invention, the metal substrate and the low-reflectivity layer are in contact with each other. This structure is preferred because heat can be efficiently conducted from the low-reflectivity layer to the metal substrate and heat can be easily conducted into the whole metal substrate.

In the case of poor adhesion (or bond strength) between the low-reflectivity layer and the metal substrate, a second thermal conduction layer is preferably provided between the low-reflectivity layer and the metal substrate. Specifically, it is preferable in the light-emitting device that the metal substrate and the low-reflectivity layer be thermally connected with the second thermal conduction layer, which has higher thermal conductivity than the low-reflectivity layer, interposed therebetween.

The second thermal conduction layer between the low-reflectivity layer and the metal substrate achieves good adhesion between the low-reflectivity layer and the second thermal conduction layer and between the second thermal conduction layer and the metal substrate. Such a structure facilitates heat conduction from the low-reflectivity layer to the metal substrate, which can promote the emission of the heat generated by the organic EL element to the outside thereof. Accordingly, a rise in the temperature of the organic EL element can be reduced and decrease of the reliability of the light-emitting device due to heat generation of the organic EL element can be reduced.

Further, the above light-emitting device preferably includes, over a surface of the metal substrate which is in contact with the atmosphere, a second high-emissivity layer (also referred to as a third layer) which has higher emissivity than the metal substrate and which overlaps with the low-reflectivity layer.

When provided in contact with the atmosphere, the second high-emissivity layer having higher emissivity than the metal substrate can promote the emission of the heat generated by the organic EL element to the outside of the light-emitting device. Thus a rise in the temperature of the organic EL element can be reduced and decrease of the reliability of the light-emitting device due to heat generation of the organic EL element can be reduced.

In the above light-emitting device, the second high-emissivity layer preferably has higher thermal conductivity than the low-reflectivity layer. In the case where the low-reflectivity layer and the metal substrate are thermally connected with the second thermal conduction layer interposed therebetween, the second high-emissivity layer preferably has higher thermal conductivity than the second thermal conduction layer. When the thermal conductivity of the second high-emissivity layer is higher than that of the low-reflectivity layer (or the second thermal conduction layer), heat in the metal substrate is conducted more to the second high-emissivity layer than to the low-reflectivity layer (or the second thermal conduction layer). Thus the heat generated by the organic EL element can be efficiently transferred to the outside of the element. Further, the thermal conductivity of the second high-emissivity layer is preferably higher, in which case the heat can be more easily conducted into the whole second high-emissivity layer and a local temperature rise can be reduced. Furthermore, the heat can be efficiently emitted to the atmosphere.

Further, in the above light-emitting device, when a layer in contact with the second high-emissivity layer is a layer having high thermal conductance, heat conduction from the layer in contact with the second high-emissivity layer to the second high-emissivity layer can be promoted. Thus a layer in contact with the second high-emissivity layer is preferably a layer having high thermal conductance. For example, in a structure of one embodiment of the present invention, the metal substrate and the second high-emissivity layer are in contact with each other. This structure is preferred because heat can be efficiently conducted from the metal substrate to the second high-emissivity layer and heat can be easily conducted into the whole metal substrate.

In the case of poor adhesion (or bond strength) between the second high-emissivity layer and the metal substrate, a third thermal conduction layer is preferably provided between the second high-emissivity layer and the metal substrate. Specifically, it is preferable that the metal substrate and the second high-emissivity layer be thermally connected with the third thermal conduction layer interposed therebetween, which has higher thermal conductivity than the low-reflectivity layer. In the case where the low-reflectivity layer and the metal substrate are thermally connected with the second thermal conduction layer interposed therebetween, the third thermal conduction layer preferably has higher thermal conductivity than the second thermal conduction layer. Since the thermal conductivity of the third thermal conduction layer is higher than that of the low-reflectivity layer (or the second thermal conduction layer), heat in the metal substrate is conducted more to the third thermal conduction layer than to the low-reflectivity layer (or the second thermal conduction layer). Thus the heat generated by the organic EL element can be efficiently transferred to the outside of the element.

The third thermal conduction layer between the second high-emissivity layer and the metal substrate achieves good adhesion between the second high-emissivity layer and the third thermal conduction layer and between the third thermal conduction layer and the metal substrate. Such a structure facilitates heat conduction from the metal substrate to the second high-emissivity layer, which can promote the emission of the heat generated by the organic EL element to the outside thereof. Accordingly, a rise in the temperature of the organic EL element can be reduced and decrease of the reliability of the light-emitting device due to heat generation of the organic EL element can be reduced.

Further, in one embodiment of the present invention, the first high-emissivity layer or the low-reflectivity layer may include a drying agent. In particular, the low-reflectivity layer of the above light-emitting device preferably includes a drying agent.

When included in the first high-emissivity layer or the low-reflectivity layer, the drying agent can adsorb moisture that enters the inside (space) of the light-emitting device during manufacturing process and remains there. Thus deterioration of the organic EL element due to moisture remaining inside the light-emitting device can be reduced.

Another embodiment of the present invention is an electronic device including the light-emitting device having any of the above structures in a display portion. Another embodiment of the present invention is a lighting device including the light-emitting device having any of the above structures in a lighting portion. In the light-emitting device of one embodiment of the present invention, reliability decrease due to heat can also be reduced while reliability decrease due to impurities such as moisture or oxygen or external force is reduced. Accordingly, a highly reliable electronic device and a highly reliable lighting device can be obtained by adopting the light-emitting device.

It is possible to provide a light-emitting device using an organic EL element, in which reliability decrease due to heat, impurities such as moisture and oxygen, and external force can be reduced. Further, it is possible to provide a highly reliable electronic device or a highly reliable lighting device, including the light-emitting device.

BRIEF DESCRIPTION OF THE DRAWINGS

In the accompanying drawings:

FIGS. 5A and 5B illustrate an example of a light-emitting device of one embodiment of the present invention;

FIG. 8 illustrates examples of a lighting device of one embodiment of the present invention.

DETAILED DESCRIPTION OF THE INVENTION

Figure 1A:
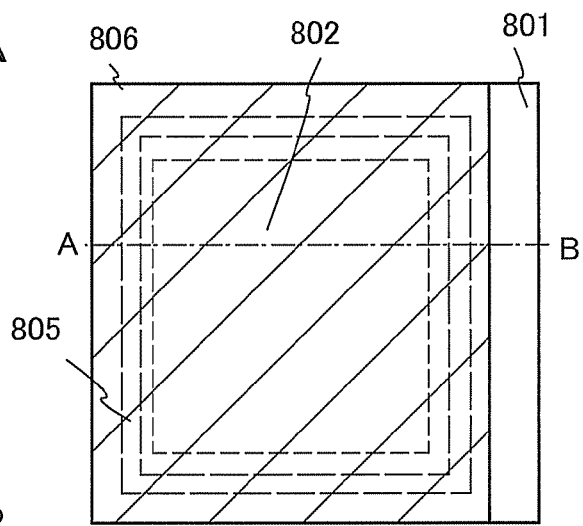
FIGS. 1A to 1C illustrate examples of a light-emitting device of one embodiment of the present invention.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. Note that in structures of the present invention described below, the same portions or portions having similar functions are denoted by the same reference numerals in different drawings, and a description thereof is not repeated.

(Embodiment 1)

In this embodiment, light-emitting devices of one embodiment of the present invention will be described with reference to FIGS. 1A to 1C and FIGS. 2A and 2B.

A light-emitting device of one embodiment of the present invention includes a light-emitting portion in a space surrounded by a support substrate, a metal substrate serving as a sealing substrate, and a sealing material. The support substrate and the metal substrate face each other. The sealing material is provided so as to surround the periphery of the light-emitting portion. The light-emitting portion includes a light-emitting element (organic EL element). The space contains gas. The light-emitting element includes a first electrode over the support substrate, a layer including a light-emitting organic compound (EL layer) over the first electrode, and a second electrode over the EL layer. The support substrate and the first electrode are each capable of transmitting light emitted from the light-emitting organic compound. Further, the light-emitting device includes, over the second electrode, a first high-emissivity layer thermally connected to the second electrode. The light-emitting device also includes a low-reflectivity layer with which a metal substrate surface facing the support substrate is provided.

The first high-emissivity layer is a layer having high emissivity. Specifically, the first high-emissivity layer has higher emissivity than the second electrode. The emissivity of the first high-emissivity layer is preferably greater than or equal to 0.25, more preferably greater than or equal to 0.5.

The low-reflectivity layer is a layer having low reflectivity. Specifically, the low-reflectivity layer has lower reflectivity than the metal substrate. The reflectivity of the low-reflectivity layer is preferably less than or equal to 0.75, more preferably less than or equal to 0.5.

The sum of reflectivity, emissivity, and transmissivity is 1. When the transmissivity of the low-reflectivity layer is high, heat emitted as an electromagnetic wave from the first high-emissivity layer could be transmitted by the low-reflectivity layer, reflected by the metal substrate, and again transmitted by the low-reflectivity layer to return to the organic EL element. Therefore the low-reflectivity layer is preferably a layer having low transmissivity and low reflectivity (i.e., a layer having high emissivity).

The light-emitting device of one embodiment of the present invention includes the light-emitting element in the space surrounded by the support substrate, the metal substrate, and the sealing material. Hence it is possible to reduce deterioration of the light-emitting element due to entry of impurities such as moisture and oxygen from the outside of the light-emitting device. Furthermore, in the above light-emitting device, owing to the space containing gas between the sealing substrate and the light-emitting element, it is possible to prevent direct application of external force to the light-emitting element, which might break the element, even when impact such as external force is applied to the sealing substrate.

Furthermore, in the above light-emitting device, owing to the first high-emissivity layer and the low-reflectivity layer, heat generated by the organic EL element is conducted from the second electrode having high thermal conductivity to the first high-emissivity layer. Then, thermal radiation occurs from the first high-emissivity layer to the low-reflectivity layer, which results in emission of the heat generated by the organic EL element to the outside thereof. Even when the heat is emitted as an electromagnetic wave from the first high-emissivity layer, the electromagnetic wave is hardly reflected by the low-reflectivity layer and accordingly return of the heat to the organic EL element is hampered. Thus a rise in the temperature of the organic EL element can be reduced and decrease of the reliability of the light-emitting device due to heat generation of the organic EL element can be reduced.

Transfer of heat generated by an organic EL element in the light-emitting device of one embodiment of the present invention is specifically explained.

Methods of transferring heat are roughly classified into three, thermal conduction, convection, and thermal radiation. Here thermal conduction and thermal radiation are considered as methods for transfer of heat generated by an organic EL element to the outside thereof.

<Thermal Conduction>

Thermal conduction is a phenomenon in which heat is transferred from a portion whose temperature is higher to a portion whose temperature is lower in an object without transfer of a substance or transport of energy.

As a material of the second electrode which is the closest to the space in an organic EL element, a metal material or an alloy material is used and a material having high reflecting properties is preferred. In general, a metal material or an alloy material has high thermal conductivity.

Note that the space contains gas in the light-emitting device of one embodiment of the present invention. Therefore the thermal conductivity of the space is low, and accordingly transferring heat generated by the organic EL element by thermal conduction to the space is difficult.

<Thermal Radiation>

Thermal radiation is also called thermal emission or temperature radiation. Thermal radiation is a phenomenon in which thermal energy from an object is emitted as an electromagnetic wave. Thermal radiation allows heat to be transferred even when there is no substance capable of conducting heat (e.g., there is a vacuum) between two objects.

The light-emitting device of one embodiment of the present invention includes, over the second electrode, the first high-emissivity layer thermally connected to the second electrode. The light-emitting device also includes the low-reflectivity layer with which a metal substrate surface facing the support substrate is provided.

The first high-emissivity layer is a layer having high emissivity. The low-reflectivity layer is a layer having low reflectivity. Heat generated by the organic EL element is conducted from the second electrode to the first high-emissivity layer. Then, thermal radiation occurs from the first high-emissivity layer to the low-reflectivity layer, which results in emission of the heat generated by the organic EL element to the outside thereof. Further, even when the heat is emitted as an electromagnetic wave from the first high-emissivity layer, the electromagnetic wave is hardly reflected by the low-reflectivity layer and accordingly return of the heat to the organic EL element is hampered. Thus, even in a light-emitting device employing hollow sealing as in one embodiment of the present invention, emission of heat generated by an organic EL element to the outside thereof can be promoted. Accordingly, in the light-emitting device of one embodiment of the present invention, a rise in the temperature of an organic EL element can be reduced and decrease of the reliability due to heat generation of the organic EL element can be reduced.

Examples of the light-emitting device of one embodiment of the present invention are described below.

STRUCTURAL EXAMPLE 1

Figure 1B:
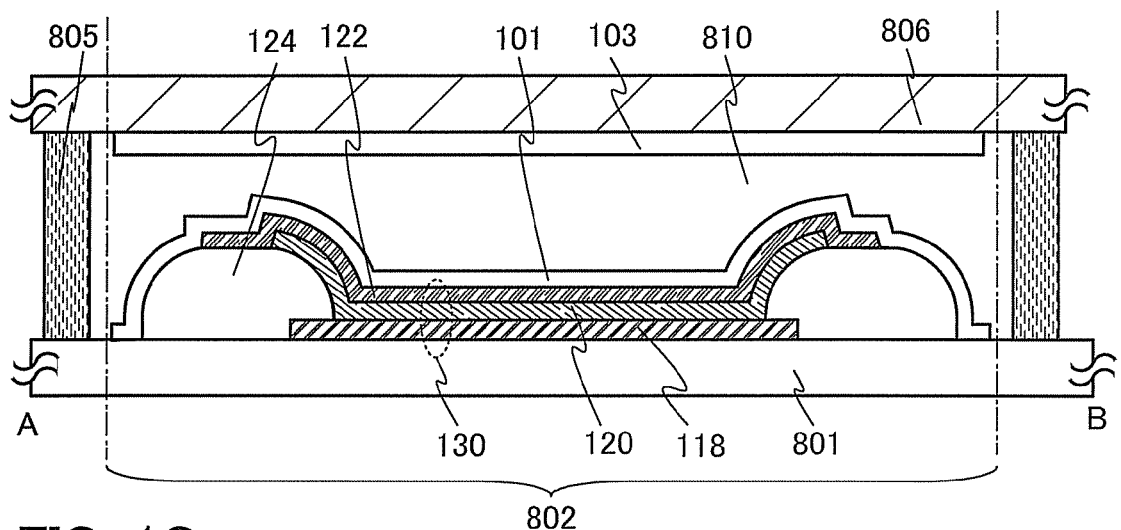

FIG. 1A illustrates a plan view of the light-emitting device of one embodiment of the present invention. FIG. 1B is a cross-sectional view along the line A-B in FIG. 1A.

In the light-emitting device illustrated in FIGS. 1A and 1B, a light-emitting portion 802 is provided in a space 810 surrounded by a support substrate 801, a metal substrate 806, and a sealing material 805.

The light-emitting portion 802 includes a light-emitting element 130 (a first electrode 118, an EL layer 120, and a second electrode 122). A partition 124 covers an end portion of the first electrode 118 and has an opening overlapping with a light-emitting region of the light-emitting element 130. A first high-emissivity layer 101 thermally connected to the second electrode 122 is provided over the second electrode 122. Further, a surface of the metal substrate 806 which faces the support substrate 801 is provided with a low-reflectivity layer 103.

The space 810 contains gas. In particular, the gas is preferably inert to the light-emitting element 130. The gas is preferably a rare gas or nitrogen, for example.

The first high-emissivity layer 101 is a layer having high emissivity. Specifically, the first high-emissivity layer 101 has higher emissivity than the second electrode 122. The emissivity of the first high-emissivity layer 101 is preferably greater than or equal to 0.25, more preferably greater than or equal to 0.5.

The low-reflectivity layer 103 is a layer having low reflectivity. Specifically, the low-reflectivity layer 103 has lower reflectivity than the metal substrate 806. The reflectivity of the low-reflectivity layer 103 is preferably less than or equal to 0.75, more preferably less than or equal to 0.5.

The light-emitting device of this embodiment includes the light-emitting element 130 in the space 810 surrounded by the support substrate 801, the metal substrate 806, and the sealing material 805. Hence it is possible to reduce deterioration of the light-emitting element 130 due to entry of impurities such as moisture and oxygen from the outside of the light-emitting device. Furthermore, in the above light-emitting device, owing to the space 810 containing the gas between the metal substrate 806 and the light-emitting element 130, it is possible to prevent direct application of external force to the light-emitting element 130, which might break the light-emitting element 130, even when impact such as external force is applied to the metal substrate 806.

Furthermore, in the light-emitting device of this embodiment, owing to the first high-emissivity layer 101 and the low-reflectivity layer 103, heat generated by the light-emitting element 130 is conducted from the second electrode 122 having high thermal conductivity to the first high-emissivity layer 101. Then, thermal radiation occurs from the first high-emissivity layer 101 to the low-reflectivity layer 103, which results in emission of the heat generated by the light-emitting element 130 to the outside of the element. Even when the heat is emitted as an electromagnetic wave from the first high-emissivity layer 101, the electromagnetic wave is hardly reflected by the low-reflectivity layer 103 and accordingly return of the heat to the light-emitting element 130 is hampered. Thus the temperature rise of the light-emitting element can be reduced and decrease of the reliability of the light-emitting device due to heat generation of the light-emitting element can be reduced.

At least part of the surface of the metal substrate 806 which faces the support substrate 801 is provided with the low-reflectivity layer 103. Similarly at least part of a surface of the second electrode 122 is provided with the first high-emissivity layer 101. In particular, the low-reflectivity layer 103 is preferably provided in a region overlapping with the first high-emissivity layer 101 as in the light-emitting device described in this embodiment, in which case the path from the first high-emissivity layer 101 to the low-reflectivity layer 103 is shortened and accordingly the heat generated by the light-emitting element 130 can be efficiently transferred to the outside of the element.

[First High-Emissivity Layer 101]

Examples of a material that can be used for the first high-emissivity layer 101 are metal oxides such as aluminum oxide, brass oxide, chromium oxide, cobalt oxide, copper oxide, nichrome oxide, iron oxide, oxide of cast iron, lead oxide, magnesium oxide, molybdenum oxide, nickel oxide, tin oxide, oxide of steel, and titanium oxide, compounds containing carbon such as graphite, diamond, fullerene, carbon nanotube, plastic, and diamond like carbon, carbides such as silicon carbide, nitrides such as aluminum nitride and boron nitride, lead, stainless steel, rubber, and the like.

A metal oxide serving as the first high-emissivity layer 101 may be formed by oxidation of the surface of the second electrode 122.

Figure 2A:
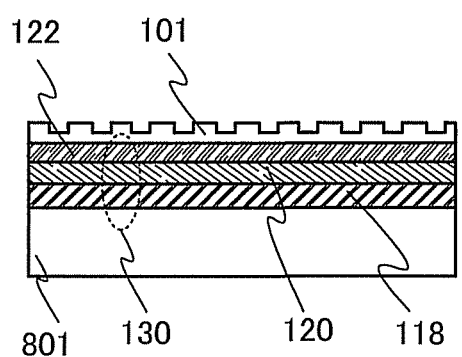
FIGS. 2A and 2B illustrate examples of a light-emitting device of one embodiment of the present invention.
Figure 2B:
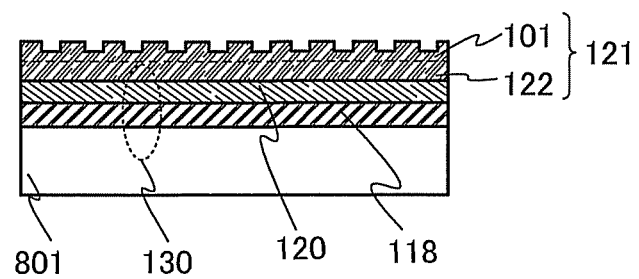

The first high-emissivity layer 101 may have unevenness so as to improve its thermal emissivity (FIG. 2A). A structure illustrated in FIG. 2B is another mode of the first high-emissivity layer 101 having unevenness, in which a metal film 121 having an uneven surface is formed over the EL layer 120, so that variations in emissivity can be made in the thickness direction of the metal film 121. For the metal film 121, a material similar to that of the second electrode 122 can be used.

Specifically, in the metal film 121 in FIG. 2B, a region in contact with the EL layer 120 (region having low emissivity) functions as the second electrode 122 and a region in contact with the space (region having unevenness and high emissivity) functions as the first high-emissivity layer 101.

The first high-emissivity layer 101 preferably has high thermal conductance. The first high-emissivity layer 101 preferably has higher thermal conductivity than the EL layer 120. In particular, the thermal conductivity of the first high-emissivity layer 101 is preferably greater than or equal to that of the second electrode 122. In addition, the thermal conductivity of the first high-emissivity layer 101 is preferably greater than or equal to 1 W/m·K, more preferably greater than or equal to 250 W/m·K.

When the thermal conductivity of the first high-emissivity layer 101 is higher than that of the EL layer 120, heat in the second electrode 122 is conducted more to the first high-emissivity layer 101 than to the EL layer 120. Accordingly, the heat generated by the light-emitting element 130 can be efficiently transferred to the outside of the element. The thermal conductivity of the first high-emissivity layer 101 is preferably higher, in which case the heat can be more easily conducted into the whole first high-emissivity layer 101 and a local temperature rise can be reduced. Further, the heat can be efficiently transferred (emitted) to the low-reflectivity layer 103.

Examples of a material having high thermal conductance which can be used for the first high-emissivity layer 101 are graphite, diamond, carbon nanotube, diamond like carbon, silicon carbide, and the like.

[Low-Reflectivity Layer 103]

Examples of a material that can be used for the low-reflectivity layer 103 are metal oxides such as aluminum oxide, brass oxide, chromium oxide, cobalt oxide, copper oxide, nichrome oxide, iron oxide, oxide of cast iron, lead oxide, magnesium oxide, molybdenum oxide, nickel oxide, tin oxide, oxide of steel, and titanium oxide, compounds containing carbon such as graphite, diamond, fullerene, carbon nanotube, plastic, and diamond like carbon, carbides such as silicon carbide, nitrides such as aluminum nitride and boron nitride, lead, stainless steel, rubber, and the like.

The low-reflectivity layer 103 preferably has higher thermal conductance than the gas contained in the space 810. The thermal conductivity of the low-reflectivity layer 103 is preferably greater than or equal to 1 W/m·K, more preferably greater than or equal to 250 W/m·K.

The thermal conductivity of the low-reflectivity layer 103 is preferably higher, in which case the heat can be more easily conducted into the whole low-reflectivity layer 103 and a local temperature rise can be reduced. Further, the heat can be efficiently transferred to the metal substrate 806.

Examples of a material having high thermal conductance which can be used for the low-reflectivity layer 103 are metal oxides such as aluminum oxide, brass oxide, chromium oxide, cobalt oxide, copper oxide, nichrome oxide, iron oxide, oxide of cast iron, lead oxide, magnesium oxide, molybdenum oxide, nickel oxide, tin oxide, oxide of steel, and titanium oxide, compounds containing carbon such as graphite, diamond, fullerene, carbon nanotube, plastic, and diamond like carbon, carbides such as silicon carbide, nitrides such as aluminum nitride and boron nitride, lead, stainless steel, rubber, and the like.

The low-reflectivity layer 103 may have unevenness so as to improve its thermal emissivity. Since the sum of reflectivity, emissivity, and transmissivity is 1, increasing the thermal emissivity can reduce reflectivity.

Further, a drying agent may be included in the first high-emissivity layer 101 or the low-reflectivity layer 103. The drying agent can adsorb moisture that enters the inside (space 810) of the light-emitting device during manufacturing process and remains there. Thus deterioration of the light-emitting element due to moisture remaining inside the light-emitting device can be reduced.

A known material can be used for the drying agent. As the drying agent, a material which adsorbs moisture and the like by chemical adsorption (referred to as a chemically adsorbing type drying agent) or a material which adsorbs moisture and the like by physical adsorption (referred to as a physically adsorbing type drying agent) can be used. Examples thereof are alkali metal oxides, alkaline earth metal oxide (e.g., calcium oxide and barium oxide), sulfate, metal halides, perchlorate, zeolite, silica gel, and the like.

A chemically adsorbing type drying agent might generate heat due to chemical reaction in adsorbing moisture or the like or might itself turned into another substance and change in volume. For the first high-emissivity layer 101, which is provided closer to the light-emitting element 130, a physically adsorbing type drying agent is preferably used so that damage to the light-emitting element 130 can be reduced.

The low-reflectivity layer 103 provided on the metal substrate 806 side (provided away from the light-emitting element 130) preferably includes a drying agent, in which case the light-emitting element 130 is not easily damaged and thus either a chemically adsorbing type drying agent or a physically adsorbing type drying agent is suitably used.

MODIFICATION EXAMPLE 1

Figure 1C:
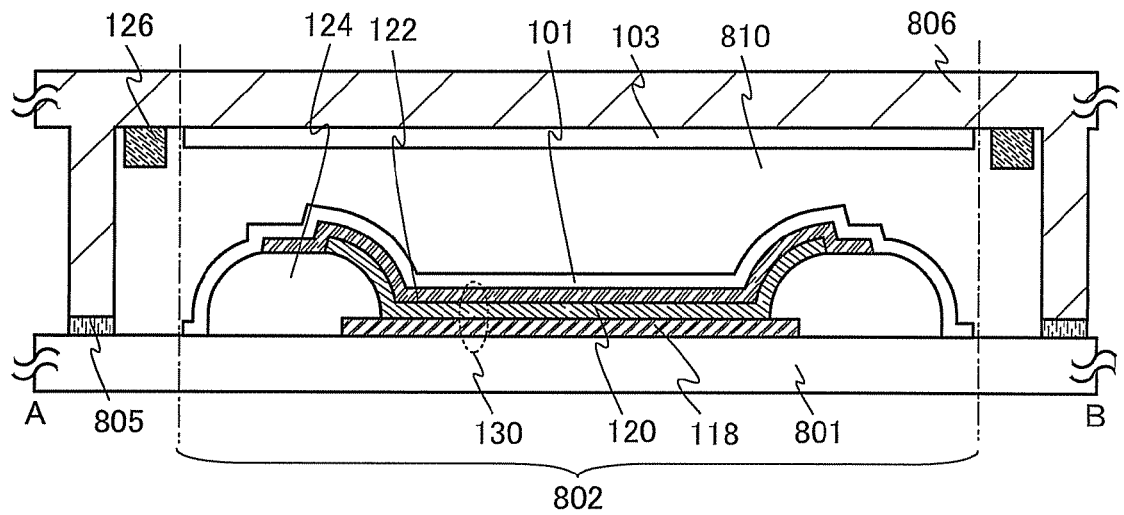

As illustrated in FIG. 1C, the metal substrate 806 may have a hollow portion in the light-emitting device of one embodiment of the present invention. It is possible to use a metal can as the metal substrate 806.

Further, a drying agent 126 may be included in the space 810. The drying agent 126 can adsorb moisture that enters the inside (space) of the light-emitting device during manufacturing process and remains there. Thus deterioration of the light-emitting element 130 due to moisture remaining inside the light-emitting device can be reduced.

STRUCTURAL EXAMPLE 2

Figure 3A:
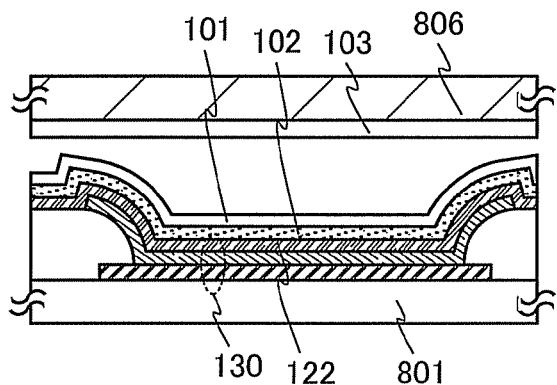
FIGS. 3A to 3E illustrate examples of a light-emitting device of one embodiment of the present invention.

A light-emitting device of one embodiment of the present invention illustrated in FIG. 3A includes a first thermal conduction layer 102 between the second electrode 122 and the first high-emissivity layer 101.

Poor adhesion (or bond strength) between the second electrode 122 and the first high-emissivity layer 101 might prevent sufficient heat conduction to the first high-emissivity layer 101 even when the second electrode 122 has high thermal conductance. In such a case, the first thermal conduction layer 102 is preferably provided.

The first thermal conduction layer 102 between the second electrode 122 and the first high-emissivity layer 101 achieves good adhesion between the second electrode 122 and the first thermal conduction layer 102 and between the first thermal conduction layer 102 and the first high-emissivity layer 101. Such a structure facilitates heat conduction from the second electrode 122 to the first high-emissivity layer 101, which can promote emission of the heat generated by the light-emitting element 130 to the outside of the element. Accordingly, a rise in the temperature of the light-emitting element 130 can be reduced and decrease of the reliability of the light-emitting device due to heat generation of the light-emitting element 130 can be reduced.

The first thermal conduction layer 102 has higher thermal conductivity than the EL layer 120. In particular, the thermal conductivity of the first thermal conduction layer 102 is preferably greater than or equal to that of the second electrode 122. In addition, the thermal conductivity of the first thermal conduction layer 102 is preferably greater than or equal to 1 W/m·K, more preferably greater than or equal to 250 W/m·K.

Since the first thermal conduction layer 102 has higher thermal conductivity than the EL layer 120, heat in the second electrode 122 is conducted more to the first thermal conduction layer 102 than to the EL layer 120. Accordingly, the heat generated by the light-emitting element 130 can be efficiently transferred to the outside of the element.

Examples of a material that can be used for the first thermal conduction layer 102 are ceramic materials, carbon nanotube, diamond, graphite, silver, copper, gold, aluminum, silicon, brass, and the like. A resin having high thermal conductance, such as an epoxy resin, a melamine resin, an acrylic resin, or a silicone resin, is preferably used. Metal filler or carbon powder may be contained in a resin having high thermal conductance.

STRUCTURAL EXAMPLE 3

Figure 3B:
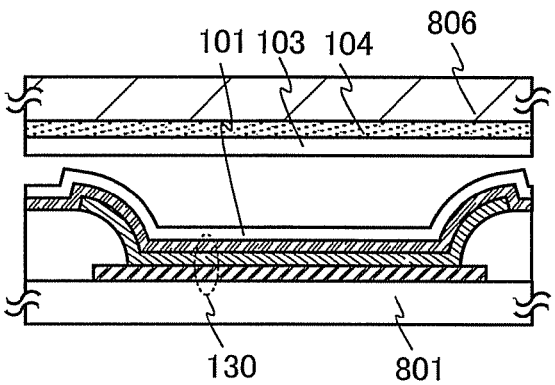

A light-emitting device of one embodiment of the present invention illustrated in FIG. 3B includes a second thermal conduction layer 104 between the low-reflectivity layer 103 and the metal substrate 806.

Poor adhesion (or bond strength) between the low-reflectivity layer 103 and the metal substrate 806 might prevent sufficient heat conduction from the low-reflectivity layer 103 to the metal substrate 806. In such a case, the second thermal conduction layer 104 is preferably provided.

The second thermal conduction layer 104 between the low-reflectivity layer 103 and the metal substrate 806 achieves good adhesion between the low-reflectivity layer 103 and the second thermal conduction layer 104 and between the second thermal conduction layer 104 and the metal substrate 806. Such a structure facilitates heat conduction from the low-reflectivity layer 103 to the metal substrate 806, which can promote the emission of the heat generated by the light-emitting element 130 to the outside of the element. Accordingly, a rise in the temperature of the light-emitting element 130 can be reduced and decrease of the reliability of the light-emitting device due to heat generation of the light-emitting element 130 can be reduced.

The second thermal conduction layer 104 has higher thermal conductivity than the low-reflectivity layer 103. The thermal conductivity of the first thermal conduction layer 102 is preferably greater than or equal to 1 W/m·K, more preferably greater than or equal to 250 W/m·K. For the second thermal conduction layer 104, a material similar to that of the first thermal conduction layer 102 can be used.

STRUCTURAL EXAMPLE 4

Figure 3C:
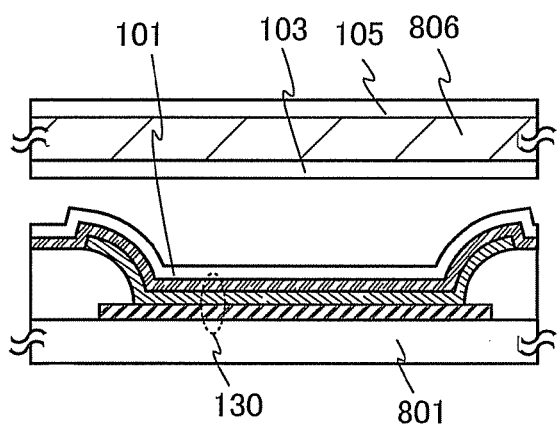

A light-emitting device of one embodiment of the present invention illustrated in FIG. 3C includes a second high-emissivity layer 105 over a surface of the metal substrate 806 which is in contact with the atmosphere.

The surface of the metal substrate which is in contact with the atmosphere may be not directly in contact with the atmosphere when the entire surface is provided with the second high-emissivity layer. Thus in one embodiment of the present invention, the metal substrate has a surface in contact with the atmosphere with the second high-emissivity layer interposed therebetween.

When provided in contact with the atmosphere, the second high-emissivity layer 105 having a high thermal emissivity can promote emission of heat generated by the element to the outside of the light-emitting device. Thus the temperature rise of the element can be reduced and decrease of the reliability of the light-emitting device due to heat generation of the element can be reduced.

The second high-emissivity layer 105 has higher thermal emissivity than the metal substrate 806. The thermal emissivity of the second high-emissivity layer 105 is preferably greater than or equal to 0.25, more preferably greater than or equal to 0.5. For the second high-emissivity layer 105, a material similar to that of the first high-emissivity layer 101 can be used. In addition, the second high-emissivity layer 105 may have unevenness so as to improve its thermal emissivity.

The second high-emissivity layer 105 preferably has higher thermal conductivity than the low-reflectivity layer 103. In the case where the low-reflectivity layer 103 and the metal substrate 806 are thermally connected with the second thermal conduction layer 104 interposed therebetween, the second high-emissivity layer 105 preferably has higher thermal conductivity than the second thermal conduction layer 104.

When the thermal conductivity of the second high-emissivity layer 105 is higher than that of the low-reflectivity layer 103 (or the second thermal conduction layer 104), heat in the metal substrate 806 is conducted more to the second high-emissivity layer 105 than to the low-reflectivity layer 103 (or the second thermal conduction layer 104). Thus heat generated by the light-emitting element can be efficiently transferred to the outside of the element. Further, the thermal conductivity of the second high-emissivity layer 105 is preferably higher, in which case the heat can be more easily conducted into the whole second high-emissivity layer 105 and the heat can be efficiently emitted to the atmosphere.

STRUCTURAL EXAMPLE 5

Figure 3D:
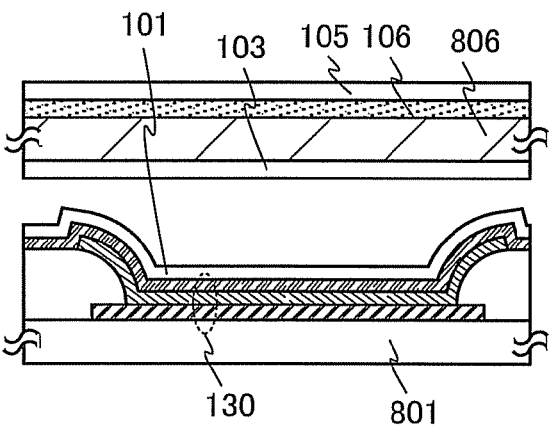

A light-emitting device of one embodiment of the present invention illustrated in FIG. 3D includes the third thermal conduction layer 106 between the second high-emissivity layer 105 and the metal substrate 806.

Poor adhesion (or bond strength) between the second high-emissivity layer 105 and the metal substrate 806 might prevent sufficient heat conduction from the metal substrate 806 to the second high-emissivity layer 105. In such a case, the third thermal conduction layer 106 is preferably provided.

The third thermal conduction layer 106 between the second high-emissivity layer 105 and the metal substrate 806 achieves good adhesion between the metal substrate 806 and the third thermal conduction layer 106 and between the third thermal conduction layer 106 and the second high-emissivity layer 105. Such a structure facilitates heat conduction from the metal substrate 806 to the second high-emissivity layer 105, which can promote the emission of the heat generated by the light-emitting element 130 to the outside of the element. Accordingly, a rise in the temperature of the light-emitting element 130 can be reduced and decrease of the reliability of the light-emitting device due to heat generation of the light-emitting element 130 can be reduced.

The third thermal conduction layer 106 has higher thermal conductivity than the low-reflectivity layer 103. In the case where the low-reflectivity layer 103 and the metal substrate 806 are thermally connected with the second thermal conduction layer 104 interposed therebetween, the third thermal conduction layer 106 preferably has higher thermal conductivity than the second thermal conduction layer 104. The thermal conductivity of the third thermal conduction layer 106 is preferably greater than or equal to 1 W/m·K, more preferably greater than or equal to 250 W/m·K. For the third thermal conduction layer 106, a material similar to that of the first thermal conduction layer 102 can be used.

When the thermal conductivity of the third thermal conduction layer 106 is higher than that of the low-reflectivity layer 103 (or the second thermal conduction layer 104), heat in the metal substrate 806 is conducted more to the third thermal conduction layer 106 than to the low-reflectivity layer 103 (or the second thermal conduction layer 104). Accordingly, the heat generated by the light-emitting element 130 can be efficiently transferred to the outside of the element.

Figure 3E:
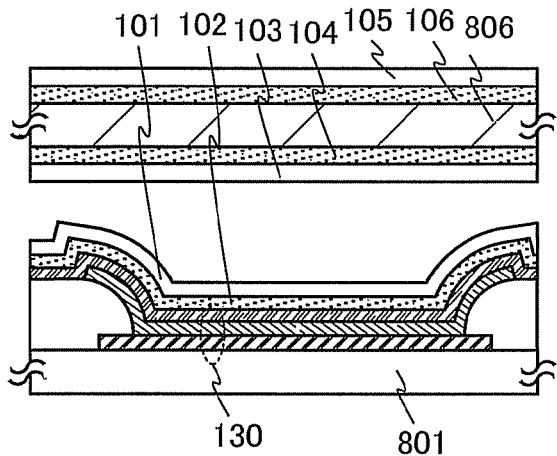

In one embodiment of the present invention, the first thermal conduction layer 102, the second thermal conduction layer 104, the second high-emissivity layer 105, and the third thermal conduction layer 106 can be used in appropriate combination. For example, as illustrated in FIG. 3E, the light-emitting device of one embodiment of the present invention may include all of the first thermal conduction layer 102, the second thermal conduction layer 104, the second high-emissivity layer 105, and the third thermal conduction layer 106.

<Material Applicable to Light-Emitting Device of One Embodiment of the Invention>

Examples of materials that can be used for the light-emitting device of one embodiment of the present invention will be described below. Note that refer to the above for the space, the thermal radiation layer, and the thermal conduction layer.

[Support Substrate 801]

Since the support substrate 801 is on the side where light from the light-emitting element 130 is extracted, a material capable of transmitting the light is used for the substrate. For example, a material such as glass, quartz, ceramics, sapphire, or an organic resin can be used.

As the glass, for example, non-alkali glass, barium borosilicate glass, aluminoborosilicate glass, or the like can be used.

As the organic resin, for example, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyether sulfone (PES) resin, a polyamide resin, a cycloolefin resin, a polystyrene resin, a polyamide imide resin, a polyvinylchloride resin, or the like can be used. Alternatively, a substrate in which a glass fiber is impregnated with an organic resin or a substrate in which an inorganic filler is mixed with an organic resin can also be used.

In order that impurities included in the support substrate 801 be prevented from being dispersed into each element provided over the support substrate 801, it is preferable to provide an insulating layer over a surface of the support substrate 801 or to subject the support substrate 801 to heat treatment.

[Metal Substrate 806]

For the metal substrate 806, a metal material or an alloy material can be used. For example, a material selected from stainless steel, aluminum, copper, nickel, and an aluminum alloy is preferably used.

[Light-Emitting Element 130]

Examples of a light-transmitting material that can be used for the first electrode 118 are indium oxide, indium tin oxide (ITO), indium oxide-zinc oxide, zinc oxide, zinc oxide to which gallium is added, and the like.

For the first electrode 118, a metal material such as gold, platinum, nickel, tungsten, chromium, molybdenum, iron, cobalt, copper, palladium, or titanium can be used. Alternatively, a nitride of the metal material (e.g., titanium nitride) or the like may be used. Graphene or the like may also be used. In the case where the metal material (or the nitride thereof) is used, the first electrode is thinned so as to be able to transmit light.

The EL layer 120 has at least a light-emitting layer. The light-emitting layer includes the light-emitting organic compound. In addition, the EL layer 120 can have a stacked-layer structure in which a layer including a substance having a high electron-transport property, a layer including a substance having a high hole-transport property, a layer including a substance having a high electron-injection property, a layer including a substance having a high hole-injection property, a layer including a bipolar substance (a substance having a high electron-transport property and a high hole-transport property), and the like are combined as appropriate. Examples of the structures of the EL layer will be described in detail in Embodiment 4.

The second electrode 122 is provided on the side opposite to the light extraction side and is formed using a reflective material. As the reflective material, a metal material such as aluminum, gold, platinum, silver, nickel, tungsten, chromium, molybdenum, iron, cobalt, copper, or palladium can be used. Alternatively, any of the following materials can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferred because of its high heat resistance. The metal material or the alloy may include lanthanum, neodymium, or germanium.

[Partition 124]

As a material of the partition 124, an organic resin or an inorganic insulating material can be used. As the organic resin, for example, a polyimide resin, a polyamide resin, an acrylic resin, a siloxane resin, an epoxy resin, a phenol resin, or the like can be used.

A negative photosensitive resin or a positive photosensitive resin is especially preferred, in which case the partition 124 can be easily formed.

The partition 124 is formed so as to cover an end portion of the first electrode 118. The partition 124 preferably has a curved surface with curvature at an upper end portion or a lower end portion thereof in order to obtain favorable coverage by the EL layer 120 or the second electrode 122 which is to be formed over the partition 124.

There is no particular limitation on the method for forming the partition. A photolithography method, a sputtering method, an evaporation method, a droplet discharging method (e.g., an inkjet method), a printing method (e.g., a screen printing method or an offset printing method), or the like can be used.

[Sealing Material 805]

The sealing material 805 can be formed using a known sealant, glass frit, or the like. Specifically, an organic resin such as a thermosetting resin or a photocurable resin or a material such as low-melting glass can be used. Note that a drying agent may be included in the sealing material 805.

[Drying Agent 126]

A known material can be used for the drying agent 126. As the drying agent, a substance which adsorbs moisture and the like by chemical adsorption or a substance which adsorbs moisture and the like by physical adsorption can be used. Examples thereof are alkali metal oxides, alkaline earth metal oxide (e.g., calcium oxide and barium oxide), sulfate, metal halides, perchlorate, zeolite, silica gel, and the like.

Hence the light-emitting device of one embodiment of the present invention has less deterioration of the organic EL element which is caused by entry of impurities such as moisture and oxygen from the outside of the light-emitting device. Furthermore, even when impact such as external force is applied to the sealing substrate, direct application of external force to the light-emitting element, which might break the element, can be prevented. Thus the temperature rise of the organic EL element can be reduced and decrease of the reliability of the light-emitting device due to heat generation of the organic EL element can be reduced.

Note that this embodiment can be combined with any of the other embodiments as appropriate.

(Embodiment 2)

Figure 4A:
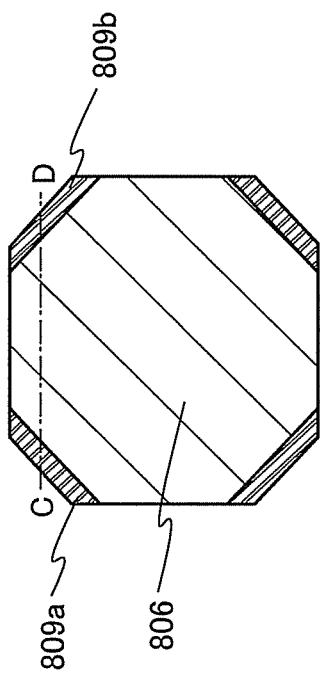
FIGS. 4A and 4B illustrate an example of a light-emitting device of one embodiment of the present invention.
Figure 4B:
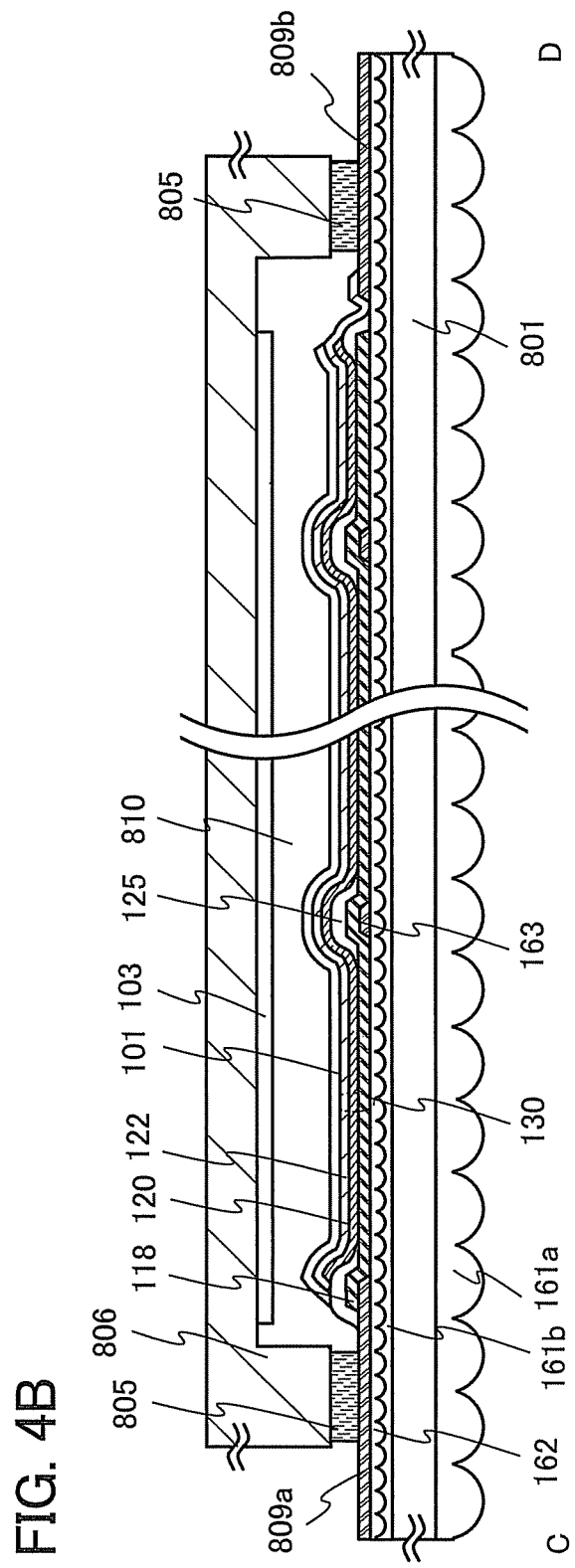

In this embodiment, a light-emitting device of one embodiment of the present invention is described using FIGS. 4A and 4B. FIG. 4A is a plan view of the light-emitting device of one embodiment of the present invention and FIG. 4B is a cross-sectional view taken along the line C-D in FIG. 4A.

The light-emitting device of this embodiment includes the light-emitting element 130 (the first electrode 118, the EL layer 120, and the second electrode 122) over the support substrate 801. Specifically, the light-emitting device includes the first electrode 118 over the support substrate 801, the EL layer 120 over the first electrode 118, and the second electrode 122 over the EL layer 120.

A first terminal 809a is electrically connected to an auxiliary wiring 163 and the first electrode 118. Over the first electrode 118, an insulating layer 125 is provided in a region overlapping with the auxiliary wiring 163 and the first terminal 809a. The first terminal 809a and the second electrode 122 are electrically insulated by the insulating layer 125. A second terminal 809b is electrically connected to the second electrode 122. Note that although the first electrode 118 is formed over the auxiliary wiring 163 in this embodiment, the auxiliary wiring 163 may be formed over the first electrode 118.

The support substrate 801 and the metal substrate 806 are bonded to each other with the sealing material 805. The space 810 contains gas. In particular, the gas is preferably inert to the light-emitting element 130. In addition, a drying agent may be included in the space 810.

The light-emitting device also includes, over the second electrode 122, the first high-emissivity layer 101 thermally connected to the second electrode. Further, a surface of the metal substrate 806 which faces the support substrate 801 is provided with the low-reflectivity layer 103.

The light-emitting device of this embodiment includes the light-emitting element 130 in the space 810 surrounded by the support substrate 801, the metal substrate 806, and the sealing material 805. Hence it is possible to reduce deterioration of the light-emitting element 130 due to entry of impurities such as moisture and oxygen from the outside of the light-emitting device. Furthermore, in the above light-emitting device, owing to the space 810 containing the gas between the metal substrate 806 and the light-emitting element 130, it is possible to prevent direct application of external force to the light-emitting element 130, which might break the light-emitting element 130, even when impact such as external force is applied to the metal substrate 806.

Furthermore, in the light-emitting device of this embodiment, owing to the first high-emissivity layer 101 and the low-reflectivity layer 103, heat generated by the light-emitting element 130 is conducted from the second electrode 122 to the first high-emissivity layer 101. Then, thermal radiation occurs from the first high-emissivity layer 101 to the low-reflectivity layer 103, which results in emission of the heat generated by the light-emitting element 130 to the outside of the element. Even when the heat is emitted as an electromagnetic wave from the first high-emissivity layer 101, the electromagnetic wave is hardly reflected by the low-reflectivity layer 103 and accordingly return of the heat to the light-emitting element 130 is hampered. Thus the temperature rise of the light-emitting element can be reduced and decrease of the reliability of the light-emitting device due to heat generation of the light-emitting element can be reduced.

Since the organic EL element emits light in a region having a refractive index higher than that of the atmosphere, total reflection may occur inside the organic EL element or at the interface between the organic EL element and the atmosphere under a certain condition when light is extracted to the atmosphere, which results in a light extraction efficiency of the organic EL element lower than 100%.

Specifically, when light from the medium A having higher refractive index than the medium B enters the medium B having lower refractive index than the EL layer, total reflection may occur depending on the incident angle.

At this time, an uneven structure is preferably provided at the interface between the medium A and the medium B. With such a structure, it is possible to prevent a phenomenon in which light entering the medium B from the medium A at an incident angle greater than the critical angle is totally reflected and the wave of the light propagates inside the light-emitting device to lower the light extraction efficiency.

For example, an uneven structure 161a is preferably provided at an interface between the support substrate 801 and the atmosphere. The refractive index of the support substrate 801 is higher than that of the atmosphere. Therefore when provided at the interface between the support substrate 801 and the atmosphere, the uneven structure 161a can reduce light which cannot be extracted to the atmosphere due to total reflection, resulting in an increase in the light extraction efficiency of the light-emitting device.

Further, an uneven structure 161b is preferably provided at an interface between the light-emitting element 130 and the support substrate 801.

However, in the organic EL element, unevenness of the first electrode 118 might cause leakage current in the EL layer 120 formed over the first electrode 118. Therefore in this embodiment, a planarization layer 162 having a refractive index higher than or equal to that of the EL layer 120 is provided in contact with the uneven structure 161b. Accordingly, the first electrode 118 can be a flat film, and generation of leakage current in the EL layer due to the unevenness of the first electrode 118 can be prevented. Further, because of the uneven structure 161b at the interface between the planarization layer 162 and the support substrate 801, light which cannot be extracted to the atmosphere due to total reflection can be reduced, so that the light extraction efficiency of the light-emitting device can be increased.

The present invention is not limited to the structure in which the support substrate 801, the uneven structure 161a, and the uneven structure 161b are different components as in FIG. 4B. Two or all of these may be formed as one component. The uneven structure 161b may be all formed inside a sealed region.

The present invention is not limited to the structure in which the light-emitting device illustrated in FIG. 4A is octagonal. The light-emitting device may have other polygonal shapes or a shape with a curve. As the shape of the light-emitting device, a triangle, a quadrilateral, a hexagon, or the like is especially preferred. This is because a plurality of light-emitting devices can be provided without a redundant space in a limited area, and also because such a shape enables effective use of the limited substrate area for formation of the light-emitting device. Further, the number of light-emitting elements included in the light-emitting device is not limited to one and may be more than one.

<Material Applicable to Light-Emitting Device of One Embodiment of the Invention>

Examples of materials that can be used for the light-emitting device of one embodiment of the present invention will be described below. Note that refer to the materials exemplified in Embodiment 1 for the substrate, the light-emitting element, the sealing material, the space, and the thermal radiation layer.

[Insulating Layer 125]

The insulating layer 125 can be formed using a material similar to that of the above-described partition 124.

[Auxiliary Wiring 163, First Terminal 809a, and Second Terminal 809b]

The auxiliary wiring 163, the first terminal 809a, and the second terminal 809b are preferably formed by the same step (at the same time), in which case the light-emitting device can be manufactured by fewer steps. For example, a single layer or a stack of layers can be formed using a material selected from copper (Cu), titanium (Ti), tantalum (Ta), tungsten (W), molybdenum (Mo), chromium (Cr), neodymium (Nd), scandium (Sc), and nickel (Ni) or an alloy material containing any of these materials as its main component.

[Uneven Structures 161a and 161b]

The pattern of the uneven structures is not particularly limited and can be, for example, a hemispherical pattern, or a pattern with an apex such as a circular cone and a pyramid (e.g., a triangular pyramid or a square pyramid). In particular, the size or height of the unevenness is preferably greater than or equal to 1 μm, in which case the influence of interference of light can be reduced. The pattern is preferably provided so that gaps are not formed between adjacent portions. The base shape is preferably a regular hexagon, for example.

The support substrate 801 can be directly provided with the uneven structures 161a and 161b. For example, they can be formed using any of the following methods as appropriate: an etching method, a sand blasting method, a microblasting processing method, a droplet discharge method, a printing method (screen printing or offset printing by which a pattern is formed), a coating method such as a spin coating method, a dipping method, a dispenser method, an imprint method, a nanoimprint method, and the like.

As a material for the uneven structures 161a and 161b, it is possible to use, for example, a resin, such as a polyester resin such as polyethylene terephthalate (PET) or polyethylene naphthalate (PEN), a polyacrylonitrile resin, a polyimide resin, an acrylic (polymethyl methacrylate) resin, a polycarbonate (PC) resin, a polyether sulfone (PES) resin, a polyamide resin, a cyclic olefin-based resin, a cycloolefin resin, a polystyrene resin, a polyamide imide resin, or a polyvinylchloride resin. A material in which two or more of the above are combined may be used. An acrylic resin is preferred because of its high visible light transmissivity. A cyclic olefin-based resin and a cycloolefin resin are preferred because they have high visible light transmissivity and high heat resistance.

As the uneven structures 161a and 161b, a hemispherical lens, a micro lens array, a film provided with an uneven structure, a light diffusing film, or the like can be used. For example, the above lens or film is attached onto the support substrate 801 with the use of an adhesive whose refractive index is substantially equal to that of the support substrate 801 or the above lens or film, so that the uneven structures 161a and 161b can be formed.

[Planarization Layer 162]

The surface of the planarization layer 162 which is in contact with the first electrode 118 is flatter than the surface of the planarization layer 162 which is in contact with the uneven structure 161b. Hence the first electrode 118 can be a flat film. Therefore leakage current in the EL layer 120 due to the unevenness of the first electrode 118 can be reduced.

As a material of the planarization layer 162, a liquid, a resin, or the like having a high refractive index can be used. The planarization layer 162 has a light-transmitting property. Examples of the resin having a high refractive index are a resin containing bromine, a resin containing sulfur, and the like, such as a sulfur-containing polyimide resin, an episulfide resin, a thiourethane resin, and a brominated aromatic resin. Polyethylene terephthalate (PET), triacetylcellulose (TAC), or the like can also be used. As the liquid having a high refractive index, a contact liquid (refractive liquid) containing sulfur and methylene iodide, or the like can be used. As a formation method, any of a variety of methods suitable for the material may be employed. For example, a film of any of the above resins is formed by a spin coating method and is hardened by heat or light, so that the planarization film can be formed. The material and the method can be selected as appropriate in consideration of the adhesion strength, ease of processing, or the like.

This embodiment can be combined with any of the other embodiments as appropriate.

(Embodiment 3)

In this embodiment, a light-emitting device of one embodiment of the present invention will be described with reference to FIGS. 5A and 5B. FIG. 5A is a plan view of the light-emitting device of one embodiment of the present invention and FIG. 5B is a cross-sectional view taken along the line E-F in FIG. 5A.

An active matrix light-emitting device according to this embodiment includes, over the support substrate 801, the light-emitting portion 802, a driver circuit portion 803 (gate side driver circuit portion), a driver circuit portion 804 (source side drive circuit portion), and the sealing material 805. The light-emitting portion 802 and the driver circuit portions 803 and 804 are sealed in the space 810 surrounded by the support substrate 801, the metal substrate 806, and the sealing material 805. The space 810 contains gas. In particular, the gas is preferably inert to the light-emitting element 130.

Since the light-emitting device includes the light-emitting portion 802 (light-emitting element 130) in the space 810 surrounded by the support substrate 801, the metal substrate 806, and the sealing material 805, the light-emitting device has less deterioration of the light-emitting element 130 due to entry of impurities such as moisture and oxygen from the outside of the light-emitting device.

The light-emitting portion 802 illustrated in FIG. 5B includes a plurality of light-emitting units each including a switching transistor 140a, a current control transistor 140b, and the first electrode 118 electrically connected to a wiring (a source electrode or a drain electrode) of the current control transistor 140b. In the light-emitting region of a light-emitting unit, a color filter 160 is provided over the first insulating layer 114.

The light-emitting element 130 includes the first electrode 118, the EL layer 120, and the second electrode 122. The partition 124 is formed so as to cover an end portion of the first electrode 118. Furthermore, the first high-emissivity layer 101 thermally connected to the second electrode 122 is provided over the second electrode 122. Further, a surface of the metal substrate 806 which faces the support substrate 801 is provided with the low-reflectivity layer 103.

The light-emitting device of this embodiment includes the light-emitting element 130 in the space 810 surrounded by the support substrate 801, the metal substrate 806, and the sealing material 805. Hence it is possible to reduce deterioration of the light-emitting element 130 due to entry of impurities such as moisture and oxygen from the outside of the light-emitting device. Furthermore, in the above light-emitting device, owing to the space 810 containing the gas between the metal substrate 806 and the light-emitting element 130, it is possible to prevent direct application of external force to the light-emitting element 130, which might break the light-emitting element 130, even when impact such as external force is applied to the metal substrate 806.

Furthermore, in the light-emitting device of this embodiment, owing to the first high-emissivity layer 101 and the low-reflectivity layer 103, heat generated by the light-emitting element 130 is conducted from the second electrode 122 having high thermal conductivity to the first high-emissivity layer 101. Then, thermal radiation occurs from the first high-emissivity layer 101 to the low-reflectivity layer 103, which results in emission of the heat generated by the light-emitting element 130 to the outside of the element. Even when the heat is emitted as an electromagnetic wave from the first high-emissivity layer 101, the electromagnetic wave is hardly reflected by the low-reflectivity layer 103 and accordingly return of the heat to the light-emitting element 130 is hampered. Thus the temperature rise of the light-emitting element can be reduced and decrease of the reliability of the light-emitting device due to heat generation of the light-emitting element can be reduced.

Over the support substrate 801, a lead wiring for connecting an external input terminal through which a signal (e.g., a video signal, a clock signal, a start signal, or a reset signal) or a potential from the outside is transmitted to the driver circuit portions 803 and 804 is provided. Here, an example in which a flexible printed circuit (FPC) 808 is provided as the external input terminal is described. Note that a printed wiring board (PWB) may be attached to the FPC 808. In this specification, the light-emitting device includes in its category the light-emitting device itself and the light-emitting device on which the FPC or the PWB is mounted.

The driver circuit portions 803 and 804 have a plurality of transistors. FIGS. 5A and 5B illustrate an example in which the driver circuit portion 803 has a CMOS circuit which is a combination of an n-channel transistor 152 and a p-channel transistor 153. A circuit included in the driver circuit portion can be formed with various types of circuits such as a CMOS circuit, a PMOS circuit, or an NMOS circuit. The present invention is not limited to a driver-integrated type described in this embodiment in which the driver circuit is formed over the substrate over which the light-emitting portion is formed. The driver circuit can be formed over a substrate that is different from the substrate over which the light-emitting portion is formed.

<Material Applicable to Light-Emitting Device of One Embodiment of the Invention>

Examples of materials that can be used for the light-emitting device of one embodiment of the present invention will be described below. Note that refer to the materials exemplified in Embodiment 1 for the substrate, the light-emitting element, the sealing material, the space, the partition, and the thermal radiation layer.

[Transistor]

There is no particular limitation on the structure of the transistor (e.g., the transistor 140a, 140b, 152, or 153) used in the light-emitting device of one embodiment of the present invention. A top-gate transistor may be used, or a bottom-gate transistor such as an inverted staggered transistor may be used. The transistor may be a channel-etched transistor or a channel-stop (channel protective) transistor. In addition, there is no particular limitation on a material used for the transistor.

As a gate electrode, a single layer or a stack of layers can be formed using any of metal materials such as molybdenum, titanium, chromium, tantalum, tungsten, aluminum, copper, neodymium, and scandium, and an alloy material which contains any of these elements, for example.

A gate insulating layer is formed with a material capable of transmitting light from the light-emitting element. As the gate insulating layer, a single layer or a stack of layers can be formed using any of silicon oxide, silicon nitride, silicon oxynitride, silicon nitride oxide, and aluminum oxide by a plasma CVD method, a sputtering method, or the like, for example.

A semiconductor layer can be formed using a silicon semiconductor or an oxide semiconductor. As a silicon semiconductor, single crystal silicon, polycrystalline silicon, or the like can be used as appropriate. As an oxide semiconductor, an In—Ga—Zn—O-based metal oxide or the like can be used as appropriate. Note that the semiconductor layer is preferably formed using an oxide semiconductor which is an In—Ga—Zn—O-based metal oxide so as to have low off-state current, in which case an off-state leakage current of the light-emitting element 130 to be formed later can be reduced.

As a source electrode layer and a drain electrode layer, a metal film containing an element selected from Al, Cr, Cu, Ta, Ti, Mo, and W, a metal nitride film containing any of these elements (e.g., a titanium nitride film, a molybdenum nitride film, or a tungsten nitride film), or the like can be used. Alternatively, a film of a high-melting-point metal such as Ti, Mo, or W or a metal nitride film thereof (e.g., a titanium nitride film, a molybdenum nitride film, or a tungsten nitride film) may be formed over and/or under a metal film such as an Al film or a Cu film. The source electrode layer and the drain electrode layer may be formed with an electrically conductive metal oxide. As the electrically conductive metal oxide, indium oxide (e.g., $In_2O_3$), tin oxide (e.g., $SnO_2$), zinc oxide (ZnO), indium tin oxide (ITO), indium oxide-zinc oxide (e.g., $In_2O_3$—ZnO), or any of these metal oxide materials including silicon oxide is can be used.

[First Insulating Layer 114 and Second Insulating Layer 116]

A first insulating layer 114 and a second insulating layer 116 are formed with a material capable of transmitting light from the light-emitting element.

The first insulating layer 114 has an effect of preventing diffusion of impurities into a semiconductor included in the transistor. As the first insulating layer 114, typically, an inorganic insulating film such as a silicon oxide film, a silicon oxynitride film, or an aluminum oxide film can be used.

As the second insulating layer 116, an insulating film having a planarization function is preferably selected in order to reduce surface unevenness due to the transistor or the color filter. For example, an organic material such as a polyimide resin, an acrylic resin, or a benzocyclobutene resin can be used. Other than such organic materials, a low-dielectric constant material (a low-k material) or the like can also be used. Note that a plurality of layers of any of these materials may be stacked to form the second insulating layer 116.

[Color Filter 160]

Over the first insulating layer 114, the color filter 160 which is a coloring layer is provided so as to overlap with the light-emitting element 130 (its light-emitting region). The color filter 160 is provided to control the color of light emitted from the light-emitting element 130. For example, in a full-color display device using white light-emitting elements, a plurality of light-emitting units provided with color filters of different colors are used. In that case, three colors, red (R), green (G), and blue (B), may be used, or four colors, red (R), green (G), blue (B), and yellow (Y), may be used.

A structure of the present invention is not limited to the light-emitting device using a color filter method, which is described as an example in this embodiment. For example, a separate coloring method or a color conversion method may be used.

This embodiment can be combined with any of the other embodiments as appropriate.

(Embodiment 4)

In this embodiment, structural examples of the EL layer applicable to a light-emitting device of one embodiment of the present invention are described with reference to FIGS. 6A to 6C.

For the EL layer, a known substance can be used, and either a low molecular compound or a high molecular compound can be used. Note that the substances forming the EL layer are not limited to having a structure of only organic compounds and may have a structure including an inorganic compound as a part.

Figure 6A:
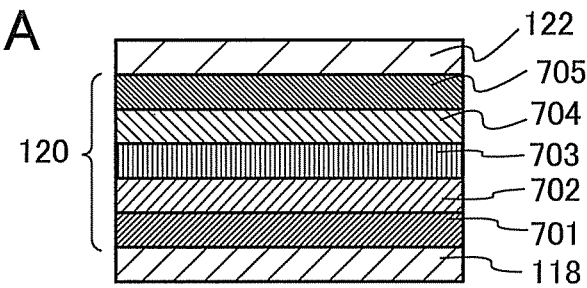
FIGS. 6A to 6C illustrate examples of an EL layer.

In FIG. 6A, the EL layer 120 is provided between the first electrode 118 and the second electrode 122. In the EL layer 120 in FIG. 6A, a hole-injection layer 701, a hole-transport layer 702, a light-emitting layer 703, an electron-transport layer 704, and an electron-injection layer 705 are stacked in that order from the first electrode 118 side.

Figure 6B:
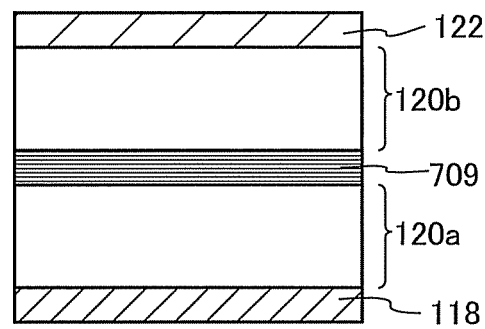

As illustrated in FIG. 6B, a plurality of EL layers may be stacked between the first electrode 118 and the second electrode 122. In that case, a charge generation layer 709 is preferably provided between a first EL layer 120a and a second EL layer 120b which are stacked. A light-emitting element having such a structure is unlikely to suffer the problem of energy transfer, quenching, or the like and gives wider choice of materials, thereby easily having both high light emission efficiency and a long lifetime. In addition, phosphorescence from one EL layer and fluorescence from another EL layer can be easily obtained. This structure can be combined with any of the above-mentioned EL layer structures.

Furthermore, different emission colors of the EL layers enable light emission of a desired color to be obtained from the light-emitting element as a whole. For example, the emission colors of first and second EL layers are complementary in a light-emitting element having the two EL layers, so that the light-emitting element can be made to emit white light as a whole. Note that the word "complementary" means color relationship in which an achromatic color is obtained when colors are mixed. In other words, when light emissions obtained from substances which emit light of complementary colors are mixed, white light emission can be obtained. This can be applied to a light-emitting element having three or more EL layers.

Figure 6C:
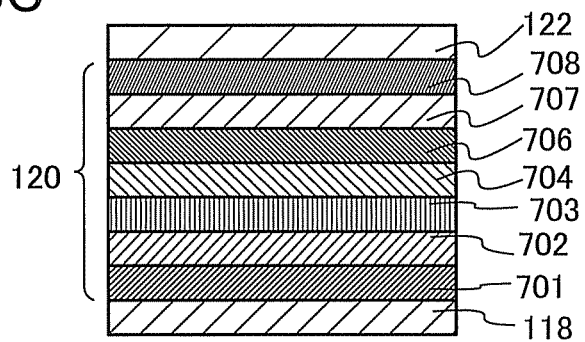

As illustrated in FIG. 6C, the EL layer 120 may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 122, between the first electrode 118 and the second electrode 122.

The composite material layer 708 is preferably provided in contact with the second electrode 122, in which case damage caused to the EL layer 120 particularly when the second electrode 122 is formed using a sputtering method can be reduced.

With the electron-injection buffer layer 706, an injection barrier between the composite material layer 708 and the electron-transport layer 704 can be reduced, and accordingly electrons generated in the composite material layer 708 can be easily injected into the electron-transport layer 704.

The electron-relay layer 707 is preferably formed between the electron-injection buffer layer 706 and the composite material layer 708. The electron-relay layer 707 is not necessarily provided; however, with the electron-relay layer 707 having a high electron-transport property, electrons can be rapidly transported to the electron-injection buffer layer 706.

The structure in which the electron-relay layer 707 is provided between the composite material layer 708 and the electron-injection buffer layer 706 is a structure in which the acceptor substance included in the composite material layer 708 and the donor substance included in the electron-injection buffer layer 706 are less likely to interact with each other, and thus their functions hardly interfere with each other. Accordingly, an increase in driving voltage can be reduced.

Examples of materials which can be used for each layer will be described below. Note that each layer is not limited to a single layer, and may be a stack of two or more layers.

<Hole-Injection Layer 701>

The hole-injection layer 701 is a layer including a substance having a high hole-injection property.

Examples of the substance having a high hole-injection property are metal oxides such as molybdenum oxide, vanadium oxide, ruthenium oxide, tungsten oxide, and manganese oxide, phthalocyanine-based compounds such as phthalocyanine ($H_2Pc$) and copper(II) phthalocyanine (CuPc), and the like.

Other examples of the substance which can be used are high molecular compounds such as poly(N-vinylcarbazole) (abbreviation: PVK), poly(4-vinyltriphenylamine) (abbreviation: PVTPA), and high molecular compounds to which acid is added such as poly(3,4-ethylenedioxythiophene)/poly (styrenesulfonic acid) (PEDOT/PSS).

In particular, a composite material containing an organic compound having a high hole-transport property and an electron acceptor is preferably used for the hole-injection layer 701. The composite material has a high hole-injection property and a high hole-transport property because holes are generated in the organic compound by the electron acceptor. With use of the composite material, hole injection from the first electrode 118 to the EL layer 120 becomes efficient, which leads to a reduction in the drive voltage of the light-emitting element.

The composite material can be formed by co-evaporation of an organic compound having a high hole-transport property and an acceptor substance. The hole-injection layer 701 is not limited to a structure in which an organic compound having a high hole-transport property and an electron acceptor are contained in the same film and can have a structure in which a layer including an organic compound having a high hole-transport property and a layer including an electron acceptor are stacked. The layer including an electron acceptor is in contact with the first electrode 118.

The organic compound used for the composite material is preferably an organic compound having a property of transporting more holes than electrons, and is especially preferably an organic compound having a hole mobility of $10^{-6}$ $cm^2/Vs$ or more. The organic compound used for the composite material can be any of a variety of compounds such as aromatic amine compounds, carbazole derivatives, aromatic hydrocarbon compounds, and high molecular compounds.

Examples of the aromatic amine compounds are 4,4'-bis [N-(1-naphthyl)-N-phenylamino]biphenyl (abbreviation: NPB or α-NPD), 4-phenyl-4'-(9-phenylfluoren-9-yl)triphenylamine (abbreviation: BPAFLP), and the like.

Examples of the carbazole derivatives are 4,4'-di(N-carbazolyl)biphenyl (abbreviation: CBP), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and the like.

Examples of the aromatic hydrocarbon compounds are 2-tent-butyl-9,10-di(2-naphthyl)anthracene (abbreviation: t-BuDNA), 9,10-di(2-naphthyl)anthracene (abbreviation: DNA), 9,10-diphenylanthracene (abbreviation: DPAnth), and the like.

Examples of the high molecular compounds are PVK, PVTPA, and the like.

Examples of the electron acceptor that can be used for the composite material are transition metal oxides and oxides of metals belonging to Group 4 to Group 8 of the periodic table. Specifically, molybdenum oxide is especially preferred. Since molybdenum oxide has stability in the atmosphere and a low hygroscopic property, it is easy to treat.

<Hole-Transport Layer 702>

The hole-transport layer 702 is a layer including a substance having a high hole-transport property.

The substance having a high hole-transport property is preferably a substance having a property of transporting more holes than electrons, and is especially preferably a substance having a hole mobility of $10^{-6}$ $cm^2/Vs$ or more. For example, any of a variety of compounds such as aromatic amine compounds such as NPB and BPAFLP, carbazole derivatives such as CBP, CzPA, and PCzPA, aromatic hydrocarbon compounds such as t-BuDNA, DNA, and DPAnth, and high molecular compounds such as PVK and PVTPA can be used.

<Light-Emitting Layer 703>

For the light-emitting layer 703, a fluorescent compound, which exhibits fluorescence, or a phosphorescent compound, which exhibits phosphorescence, can be used.

Examples of the fluorescent compound that can be used for the light-emitting layer 703 are N,N'-bis[4-(9H-carbazol-9-yl)phenyl]-N,N'-diphenylstilbene-4,4'-diamine (abbreviation: YGA2S), N-(9,10-diphenyl-2-anthryl)-N,9-diphenyl-9H-carbazol-3-amine (abbreviation: 2PCAPA), rubrene, and the like.

Examples of the phosphorescent compound that can be used for the light-emitting layer 703 are organometallic complexes such as bis[2-(4',6'-difluoropheny)pyridinato-$N,C^{2'}$] iridium(III) picolinate (abbreviation: FIrpic), tris(2-phenylpyridinato-$N,C^{2'}$)iridium(III) (abbreviation: $Ir(ppy)_3$), and (acetylacetonato)bis(3,5-dimethyl-2-phenylpyridinato) iridium(III) (abbreviation: $Ir(mppr-Me)_2(acac)$).

Note that the light-emitting layer 703 may have a structure in which any of the above-described light-emitting organic compounds (a light-emitting substance or a guest material) is dispersed in another substance (a host material). As the host material, any of a variety of materials can be used, and it is preferable to use a substance which has a lowest unoccupied molecular orbital level (LUMO level) higher than that of the guest material and has a highest occupied molecular orbital level (HOMO level) lower than that of the guest material.

When a structure in which a guest material is dispersed in a host material is employed, crystallization of the light-emitting layer 703 can be suppressed. Further, concentration quenching due to high concentration of the guest material can be prevented.

Specific examples of the host material that can be used are metal complexes, such as tris(8-quinolinolato)aluminum(III) (abbreviation: Alq) and bis(2-methyl-8-quinolinolato)(4-phenylphenolato)aluminum(III) (abbreviation: BAlq), heterocyclic compounds such as 3-(4-biphenylyl)-4-phenyl-5-(4-tert-butylphenyl)-1,2,4-triazole (abbreviation: TAZ), bathophenanthroline (abbreviation: BPhen), and bathocuproine (abbreviation: BCP), condensed aromatic compounds such as CzPA, DNA, t-BuDNA, and DPAnth, aromatic amine compounds such as NPB, and the like.

Alternatively, as the host material, a plurality of materials can be used. For example, in order to suppress crystallization, a substance such as rubrene which suppresses crystallization, may be further added. In addition, NPB, Alq, or the like may be further added in order to efficiently transfer energy to the guest material.

Further, when a plurality of light-emitting layers are provided and emission colors of the layers are made different, light emission of a desired color can be obtained from the light-emitting element as a whole. For example, the emission colors of first and second light-emitting layers are complementary in a light-emitting element having the two light-emitting layers, so that the light-emitting element can be made to emit white light as a whole. This can be applied to a light-emitting element having three or more light-emitting layers.

<Electron-Transport Layer 704>

The electron-transport layer 704 is a layer including a substance having a high electron-transport property.

The substance having a high electron-transport property is preferably an organic compound having a property of transporting more electrons than holes, and is especially preferably an organic compound having an electron mobility of $10^{-6}$ cm$^2$/Vs or more.

As the substance having a high electron-transport property, for example, a metal complex having a quinoline skeleton or a benzoquinoline skeleton, such as Alq or Balq, can be used. Alternatively, a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) or the like can be used. Alternatively, TAZ, BPhen, BCP, or the like can be used.

<Electron-Injection Layer 705>

The electron-injection layer 705 is a layer including a substance having a high electron-injection property.

Examples of the substance having a high electron-injection property are alkali metals, alkaline earth metals, and compounds thereof, such as lithium, cesium, calcium, lithium fluoride, cesium fluoride, calcium fluoride, and lithium oxide. A rare earth metal compound such as erbium fluoride can also be used. Any of the above substances used for the electron-transport layer 705 can also be used.

Note that the hole-injection layer 701, the hole-transport layer 702, the light-emitting layer 703, the electron-transport layer 704, and the electron-injection layer 705 which are described above can each be formed by a method such as an evaporation method (e.g., a vacuum evaporation method), an inkjet method, or a coating method.

<Charge Generation Layer 709>

The charge generation layer 709 illustrated in FIG. 6B can be formed using the above-mentioned composite material. Further, the charge generation layer 709 may have a stacked-layer structure including a layer including the composite material and a layer including another material. In that case, as the layer including another material, a layer including an electron donating substance and a substance having a high electron-transport property, a layer formed of a transparent electrically conductive film, or the like can be used.

<Composite Material Layer 708>

For the composite material layer 708 illustrated in FIG. 6C, the above-described composite material containing an organic compound having a high hole-transport property and an electron acceptor can be used.

<Electron-Injection Buffer Layer 706>

For the electron-injection buffer layer 706, a substance having a high electron-injection property, such as an alkali metal, an alkaline earth metal, a rare earth metal, or a compound of the above metal (e.g., an oxide such as lithium oxide, a halide, and a carbonate such as lithium carbonate or cesium carbonate) can be used.

In addition, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can also be used other than any of alkali metals, alkaline-earth metals, rare-earth metals, and compounds thereof. Note that as the substance having a high electron-transport property, a material similar to the material for the electron-transport layer 704 described above can be used.

<Electron-Relay Layer 707>

The electron-relay layer 707 contains a substance having a high electron-transport property and is formed so that the LUMO level of the substance having a high electron-transport property is located between the LUMO level of the acceptor substance included in the composite material layer 708 and the LUMO level of the substance having a high electron-transport property which is included in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property which is included in the electron-transport layer 704. As a specific value of the energy level, the LUMO level of the substance having a high electron-transport property which is included in the electron-relay layer 707 is preferably greater than or equal to −5.0 eV, more preferably greater than or equal to −5.0 eV and less than or equal to −3.0 eV.

As the substance having a high electron-transport property which is included in the electron-relay layer 707, a phthalocyanine-based material or a metal complex having a metal-oxygen bond and an aromatic ligand is preferably used.

As the phthalocyanine-based material included in the electron-relay layer 707, specifically, CuP, vanadyl 2,9,16,23-tetraphenoxy-29H,31H-phthalocyanine (PhO-VOPc), or the like can be used.

As the metal complex having a metal-oxygen bond and an aromatic ligand, which is included in the electron-relay layer 707, a metal complex having a metal-oxygen double bond is preferably used. The metal-oxygen double bond has an acceptor property (a property of easily accepting electrons); thus, electrons can be transferred (donated and accepted) more easily.

As a metal complex having a metal-oxygen bond and an aromatic ligand, a phthalocyanine-based material is preferable. In particular, a material having a high acceptor property in which a metal-oxygen double bond is more likely to act on another molecule in terms of a molecular structure is preferred.

Note that as the phthalocyanine-based material described above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent and therefore has the advantage of being easy to handle during formation of the light-emitting element and the advantage of facilitating maintenance of an apparatus used for film formation.

The electron-relay layer 707 may further include a donor substance. The donor substance can be a material similar to the donor substance that can be included in the electron-injection buffer layer 706. When such a donor substance is included in the electron-relay layer 707, electrons can be transferred easily and the light-emitting element can be driven at lower voltage.

In the case where a donor substance is included in the electron-relay layer 707, in addition to the materials described above, a substance having a LUMO level higher than the acceptor level of the acceptor substance included in the composite material layer 708 can be used as the substance having a high electron-transport property. Specifically, it is preferable to use a substance having a LUMO level higher than or equal to −5.0 eV, preferably higher than or equal to −5.0 eV and lower than or equal to −3.0 eV. Examples of such a substance are a perylene derivative such as 3,4,9,10-perylenetetracarboxylic dianhydride (abbreviation: PTCDA), a nitrogen-containing condensed aromatic compound such as pirazino[2,3-f][1,10]phenanthroline-2,3-dicarbonitrile (abbreviation: PPDN), and the like. Note that a nitrogen-containing condensed aromatic compound is preferably used for the electron-relay layer 707 because of its stability.

In the above manner, the EL layer in this embodiment can be formed.

This embodiment can be freely combined with any of the other embodiments.

(Embodiment 5)

In this embodiment, with reference to FIGS. 7A to 7E, FIG. 8, and FIGS. 9A to 9C, description is given of examples of a variety of electronic devices and lighting devices that are each completed by use of a light-emitting device of one embodiment of the present invention.

In the light-emitting device of one embodiment of the present invention, reliability decrease due to heat can also be reduced while reliability decrease due to impurities such as moisture or oxygen or external force is reduced. Accordingly, a highly reliable electronic device and a highly reliable lighting device can be obtained by adopting the light-emitting device of one embodiment of the present invention.

Examples of the electronic devices to which the light-emitting device is applied are a television device (also referred to as television or television receiver), a monitor of a computer or the like, a camera such as a digital camera or a digital video camera, a digital photo frame, a mobile phone (also referred to as cellular phone or cellular phone device), a portable game machine, a portable information terminal, an audio reproducing device, a large-sized game machine such as a pachinko machine, and the like. Specific examples of these electronic devices and a lighting device are illustrated in FIGS. 7A to 7E, FIG. 8, and FIGS. 9A to 9C.

Figure 7A:
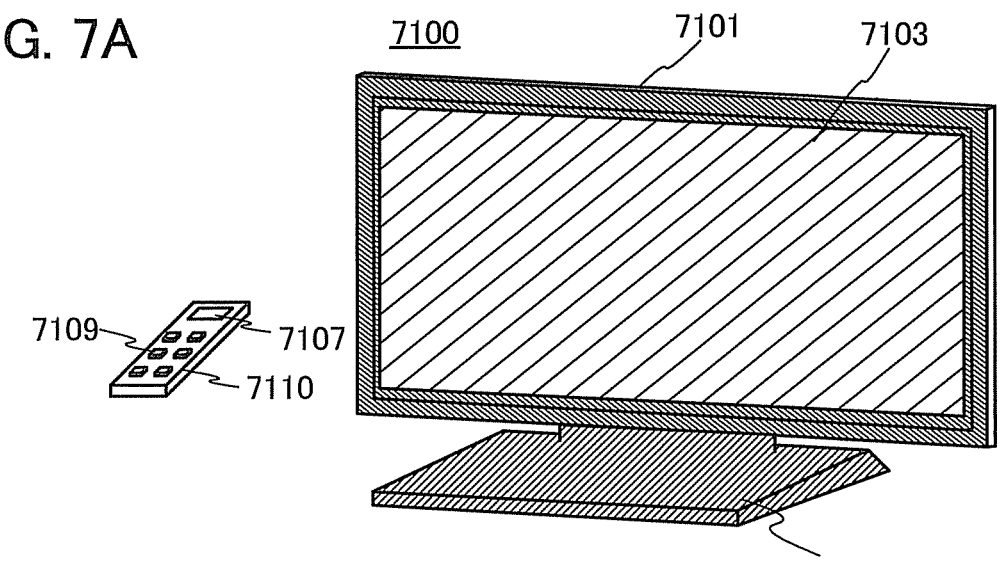
FIGS. 7A to 7E illustrate examples of electronic devices and a lighting device of one embodiment of the present invention.

FIG. 7A illustrates an example of a television device. In a television device 7100, a display portion 7103 is incorporated in a housing 7101. The display portion 7103 is capable of displaying images, and the light-emitting device of one embodiment of the present invention can be used for the display portion 7103. A highly reliable television device can be obtained by using the light-emitting device of one embodiment of the present invention for the display portion 7103. Here, the housing 7101 is supported by a stand 7105.

Operation of the television device 7100 can be performed with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 7B:
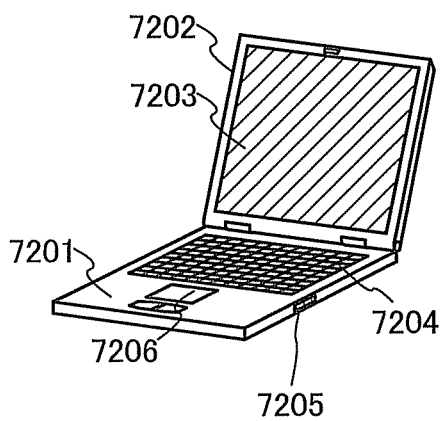

FIG. 7B illustrates a computer having a main body 7201, a housing 7202, a display portion 7203, a keyboard 7204, an external connection port 7205, a pointing device 7206, and the like. Note that this computer is manufactured using the light-emitting device of one embodiment of the present invention for the display portion 7203. A highly reliable computer can be obtained by using the light-emitting device of one embodiment of the present invention for the display portion 7203.

Figure 7C:
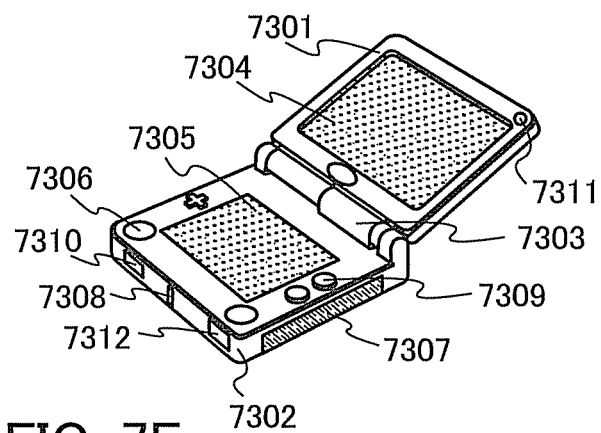

FIG. 7C illustrates a portable game machine having two housings, a housing 7301 and a housing 7302, which are connected with a joint portion 7303 so that the portable game machine can be opened or folded. A display portion 7304 is incorporated in the housing 7301, and a display portion 7305 is incorporated in the housing 7302. In addition, the portable game machine illustrated in FIG. 7C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the light-emitting device of one embodiment of the present invention is used for at least one of the display portion 7304 and the display portion 7305, and may include other accessories as appropriate. A highly reliable portable game machine can be obtained by using the light-emitting device of one embodiment of the present invention for the display portion 7304 and/or the display portion 7305. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above.

Figure 7D:
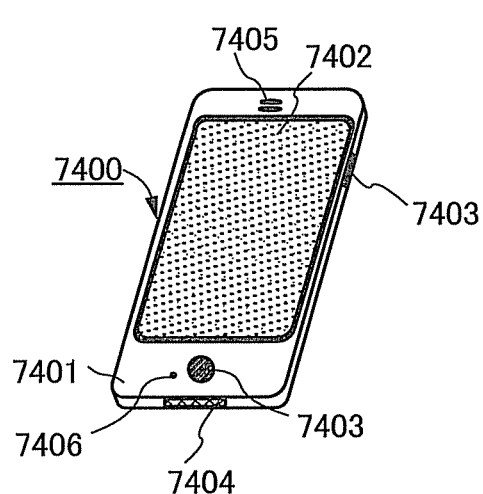

FIG. 7D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using the light-emitting device of one embodiment of the present invention for the display portion 7402. A highly reliable mobile phone can be obtained by using the light-emitting device of one embodiment of the present invention for the display portion 7402.

When the display portion 7402 of the mobile phone 7400 illustrated in FIG. 7D is touched with a finger or the like, data can be input into the mobile phone 7400. Further, operations such as making a call and composing an e-mail can be performed by touching the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on the screen can be inputted. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically switched by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can also be switched depending on the kind of image displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken when the display portion 7402 is touched with the palm or the finger, whereby personal authentication can be performed. Further, by providing a backlight or a sensing light source which emits near-infrared light in the display portion, an image of a finger vein, a palm vein, or the like can be taken.

Figure 7E:
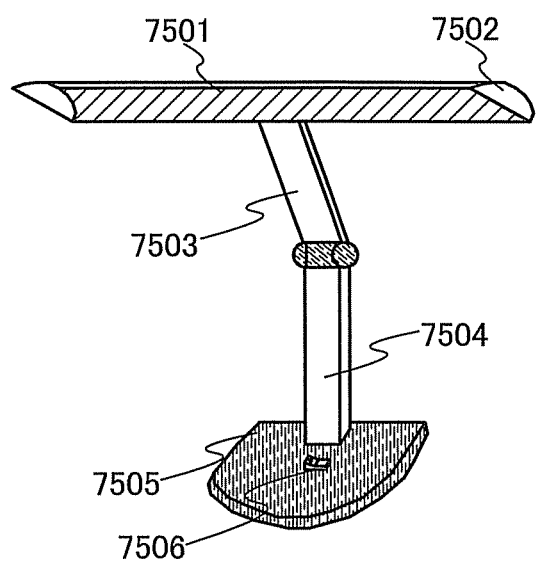

FIG. 7E illustrates a desk lamp, which includes a lighting portion 7501, a shade 7502, an adjustable arm 7503, a support 7504, a base 7505, and a power switch 7506. The desk lamp is manufactured using the light-emitting device of one embodiment of the present invention for the lighting portion 7501. A highly reliable desk lamp can be obtained by using the light-emitting device of one embodiment of the present invention for the lighting portion 7501. Note that the "lighting device" also includes ceiling lights, wall lights, and the like.

FIG. 8 illustrates an example in which the light-emitting device of one embodiment of the present invention is used for an interior lighting device 811. Since the light-emitting device of one embodiment of the present invention can have a larger area, it can be used as a large-area lighting device. Furthermore, the light-emitting device can be used as a roll-type lighting device 812. As illustrated in FIG. 8, a desk lamp 813 described with reference to FIG. 7E may also be used in a room provided with the interior lighting device 811.

Figure 9A:
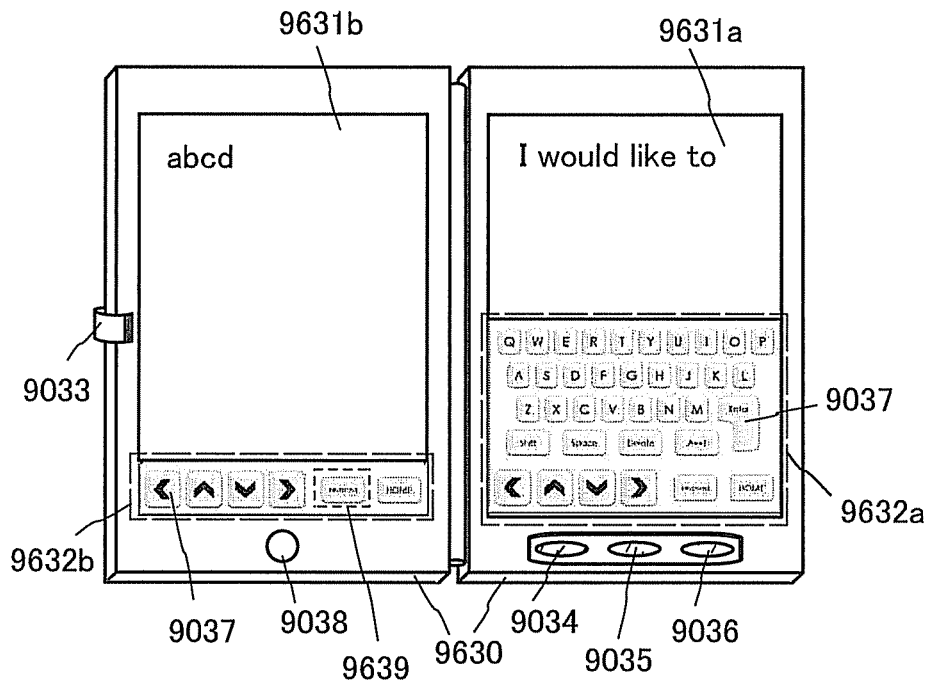
FIGS. 9A to 9C illustrate an example of an electronic device of one embodiment of the present invention.
Figure 9B:
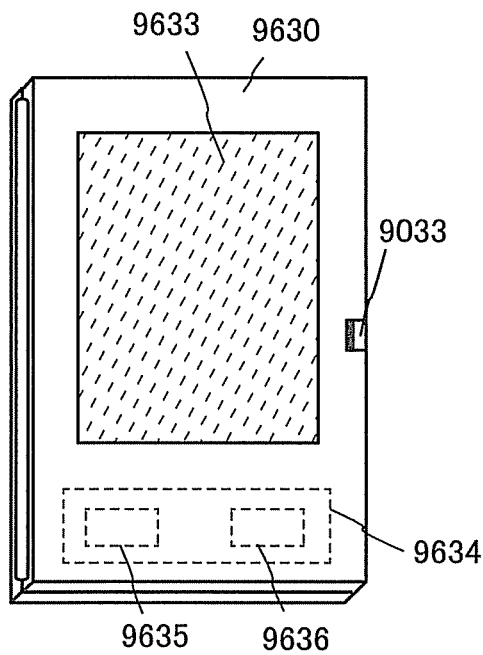

FIGS. 9A and 9B illustrate a foldable tablet terminal. The tablet terminal is opened in FIG. 9A. The tablet terminal includes a housing 9630, a display portion 9631a, a display portion 9631b, a display mode switch 9034, a power switch 9035, a power saver switch 9036, a clasp 9033, and an operation switch 9038.

Part of the display portion 9631a can be a touch panel region 9632a and data can be input when a displayed operation key 9037 is touched. Although a structure in which a half region in the display portion 9631a has only a display function and the other half region also has a touch panel function is shown as an example, the display portion 9631a is not limited to the structure. The whole region in the display portion 9631a may have a touch panel function. For example, the display portion 9631a can display keyboard buttons in the whole region to be a touch panel, and the display portion 9631b can be used as a display screen.

Similarly to the display portion 9631a, part of the display portion 9631b can be a touch panel region 9632b. A switching button 9639 for showing/hiding a keyboard of the touch panel is touched with a finger, a stylus, or the like, so that keyboard buttons can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

Note that FIG. 9A shows an example in which the display portion 9631a and the display portion 9631b have the same display area; however, without limitation thereon, one of the display portions may be different from the other display portion in size and display quality. For example, one display panel may be capable of higher-definition display than the other display panel.

The tablet terminal is closed in FIG. 9B. The tablet terminal includes the housing 9630, a solar cell 9633, a charge and discharge control circuit 9634, a battery 9635, and a DCDC converter 9636. In FIG. 9B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 9A and 9B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that a structure in which the solar cell 9633 is provided on one or two surfaces of the housing 9630 is preferable to charge the battery 9635 efficiently. When a lithium ion battery is used as the battery 9635, there is an advantage of downsizing or the like.

Figure 9C:
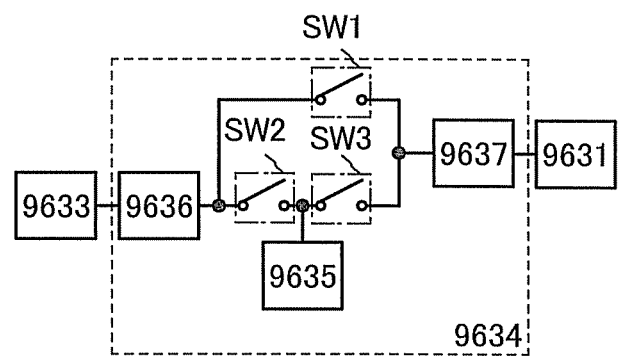

The structure and the operation of the charge and discharge control circuit 9634 illustrated in FIG. 9B will be described with reference to a block diagram in FIG. 9C. The solar cell 9633, the battery 9635, the DCDC converter 9636, a converter 9637, switches SW1 to SW3, and the display portion 9631 are illustrated in FIG. 9C, and the battery 9635, the DCDC converter 9636, the converter 9637, and the switches SW1 to SW3 correspond to the charge and discharge control circuit 9634 illustrated in FIG. 9B.

First, an example of the operation in the case where power is generated by the solar cell 9633 using external light is described. The voltage of power generated by the solar battery is raised or lowered by the DCDC converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and the switch SW2 is turned on so that charge of the battery 9635 may be performed.

Note that the solar cell 9633 is described as an example of a power generation means; however, without limitation thereon, the battery 9635 may be charged using another power generation means such as a piezoelectric element or a thermoelectric conversion element (Peltier element). For example, a non-contact electric power transmission module which transmits and receives power wirelessly (contactlessly) to charge the battery 9635, or a combination of the solar cell 9633 and another means for charge may be used.

As described above, electronic devices and lighting devices can be obtained by application of the light-emitting device of one embodiment of the present invention. The light-emitting device of one embodiment of the present invention has a remarkably wide application range, and can be applied to electronic devices in a variety of fields.

Note that the structure described in this embodiment can be combined with the structure described in any of the above embodiments as appropriate.

This application is based on Japanese Patent Application Ser. no. 2011-249590 filed with the Japan Patent Office on Nov. 15, 2011, the entire contents of which are hereby incorporated by reference.

What is claimed is:

1. A light-emitting device comprising:
a support substrate;
a light-emitting portion over the support substrate, the light-emitting portion comprising a light-emitting element, the light-emitting element comprising a first electrode, a layer comprising a light-emitting organic compound over the first electrode, and a second electrode over the layer;
a first layer over the second electrode, the first layer having higher emissivity than the second electrode;
a second layer over the first layer; and
a metal substrate over the second layer,
wherein the second layer has lower reflectivity than the metal substrate, and
wherein the support substrate and the first electrode are each capable of transmitting light.

2. The light-emitting device according to claim 1, wherein the second layer is provided in a region overlapping with the first layer.

3. The light-emitting device according to claim 1, wherein the first layer has higher thermal conductivity than the layer comprising the light-emitting organic compound.

4. The light-emitting device according to claim 1, further comprising a first thermal conduction layer between the second electrode and the first layer, wherein the first thermal conduction layer has higher thermal conductivity than the layer comprising the light-emitting organic compound.

5. The light-emitting device according to claim 1, wherein thermal conductivity of the second layer is greater than or equal to 1 W/m·K.

6. The light-emitting device according to claim 1, further comprising a second thermal conduction layer between the metal substrate and the second layer, wherein the second thermal conduction layer has higher thermal conductivity than the second layer.

7. The light-emitting device according to claim 1, wherein the second layer comprises a drying agent.

8. The light-emitting device according to claim 1, wherein each of the first layer and the second layer comprises a material selected from a metal oxide, a compound comprising carbon, a carbide, a nitride, lead, stainless steel, and rubber.

9. The light-emitting device according to claim 8, wherein the material in the first layer and the material in the second layer are the same.

10. The light-emitting device according to claim 1, wherein the first layer comprises unevenness.

11. The light-emitting device according to claim 1, further comprising a sealing material,
wherein the support substrate, the metal substrate, and the sealing material surround a space, and
wherein the space contains gas.

12. The light-emitting device according to claim 1, wherein the light-emitting device is included in a display portion of an electronic device.

13. The light-emitting device according to claim 1, wherein the light-emitting device is included in a lighting portion of a lighting device.

14. A light-emitting device comprising:
a support substrate;
a light-emitting portion over the support substrate, the light-emitting portion comprising a light-emitting element, the light-emitting element comprising a first electrode, a layer comprising a light-emitting organic compound over the first electrode, and a second electrode over the layer;
a first layer over the second electrode, the first layer having higher emissivity than the second electrode;
a second layer over the first layer;
a metal substrate over the second layer; and
a third layer over the metal substrate, the third layer having higher emissivity than the metal substrate,
wherein the second layer has lower reflectivity than the metal substrate, and
wherein the support substrate and the first electrode are each capable of transmitting light.

15. The light-emitting device according to claim 14, wherein the second layer is provided in a region overlapping with the first layer.

16. The light-emitting device according to claim 14, wherein the first layer has higher thermal conductivity than the layer comprising the light-emitting organic compound.

17. The light-emitting device according to claim 14, further comprising a first thermal conduction layer between the second electrode and the first layer, wherein the first thermal conduction layer has higher thermal conductivity than the layer comprising the light-emitting organic compound.

18. The light-emitting device according to claim 14, wherein thermal conductivity of the second layer is greater than or equal to 1 W/m·K.

19. The light-emitting device according to claim 14, further comprising a second thermal conduction layer between the metal substrate and the second layer, wherein the second thermal conduction layer has higher thermal conductivity than the second layer.

20. The light-emitting device according to claim 14, wherein the third layer has higher thermal conductivity than the second layer.

21. The light-emitting device according to claim 14, further comprising a third thermal conduction layer between the metal substrate and the third layer, wherein the third thermal conduction layer has higher thermal conductivity than the second layer.

22. The light-emitting device according to claim 14, wherein the second layer comprises a drying agent.

23. The light-emitting device according to claim 14, wherein each of the first layer and the second layer comprises a material selected from a metal oxide, a compound comprising carbon, a carbide, a nitride, lead, stainless steel, and rubber.

24. The light-emitting device according to claim 23, wherein the material in the first layer and the material in the second layer are the same.

25. The light-emitting device according to claim 14, wherein the first layer comprises unevenness.

26. The light-emitting device according to claim 14, further comprising a sealing material,
wherein the support substrate, the metal substrate, and the sealing material surround a space, and
wherein the space contains gas.

27. The light-emitting device according to claim 14, wherein the light-emitting device is included in a display portion of an electronic device.

28. The light-emitting device according to claim 14, wherein the light-emitting device is included in a lighting portion of a lighting device.

* * * * *